United States Patent
Halahan et al.

(10) Patent No.: US 6,897,148 B2
(45) Date of Patent: May 24, 2005

(54) ELECTROPLATING AND ELECTROLESS PLATING OF CONDUCTIVE MATERIALS INTO OPENINGS, AND STRUCTURES OBTAINED THEREBY

(75) Inventors: Patrick A. Halahan, San Mateo, CA (US); Sam Kao, San Mateo, CA (US); Bosco Lan, Fremont, CA (US); Sergey Savastiouk, San Jose, CA (US); Oleg Siniaguine, San Carlos, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/410,929

(22) Filed: Apr. 9, 2003

(65) Prior Publication Data

US 2004/0203224 A1 Oct. 14, 2004

(51) Int. Cl.$^7$ .............................................. H01L 21/44
(52) U.S. Cl. ..................... 438/678; 438/667; 438/674; 438/687
(58) Field of Search ............................... 438/667, 671, 438/674, 678, 687, 977

(56) References Cited

U.S. PATENT DOCUMENTS

| | | |
|---|---|---|
| 3,761,782 A | 9/1973 | Youmans |
| 4,580,331 A | 4/1986 | Soclof |
| 4,842,699 A | 6/1989 | Hua et al. |
| 5,229,647 A | 7/1993 | Gnadinger |
| 5,436,504 A | 7/1995 | Chakravorty et al. |
| 5,652,693 A | 7/1997 | Chou et al. |
| 5,843,844 A | 12/1998 | Miyanaga |
| 5,846,879 A | 12/1998 | Winnerl et al. |

(Continued)

OTHER PUBLICATIONS

Boellard, E. et al., "RF–Devices Realized in MEMS by Using Electrodepositable Photoresist", Delft University of Technology, The Netherlands, (World Wide Web at http://www.stw.nl/programmas/safe/proc2000/boellaard.pdf), pp. 1–7.

(Continued)

Primary Examiner—David Nelms
Assistant Examiner—Quoc Hoang
(74) Attorney, Agent, or Firm—Michael Shenker; MacPherson Kwok Chen & Heid LLP

(57) ABSTRACT

A through hole (114) is formed in a wafer (104) comprising a semiconductor substrate (110). A seed layer (610) is sputtered on the bottom surface of the wafer. The seed is not deposited over the through hole's sidewalls adjacent the top surface of the wafer. A conductor (810) is electroplated into the through hole. In another embodiment, a seed is deposited into an opening in a wafer through a dry film resist mask (1110). The dry film resist overhangs the edges of the opening, so the seed is not deposited over the opening's sidewalls adjacent the top surface of the wafer. In another embodiment, a dielectric (120) is formed in an opening in a semiconductor substrate (110) by a non-conformal physical vapor deposition (PVD) process that deposits the dielectric on the sidewalls but not the bottom of the opening. A seed (610) is formed on the bottom by electroless plating. A conductor (810) is electroplated on the seed. In another embodiment, a dielectric (2910) is formed in the opening to cover the entire surface of the opening. A non-conformal layer (120) is deposited by PVD over the sidewalls but not the bottom of the opening. The dielectric (2910) is etched off the bottom with the non-conformal layer (120) as a mask. A seed (610) is formed on the bottom by electroless plating. The non-conformal layer can be formed by electroplating. It can be tantalum deposited by electroplating, then anodized. Other embodiments are also provided.

80 Claims, 26 Drawing Sheets

U.S. PATENT DOCUMENTS

| | | | |
|---|---|---|---|
| 5,985,105 | A | 11/1999 | Smoliar |
| 6,080,596 | A | 6/2000 | Vindasius et al. |
| 6,184,060 | B1 | 2/2001 | Siniaguine |
| 6,204,997 | B1 | 3/2001 | Sasaki |
| 6,264,851 | B1 | 7/2001 | Markovich et al. |
| 6,322,903 | B1 | 11/2001 | Siniaguine et al. |
| 6,399,479 | B1 | 6/2002 | Chen et al. |
| 6,540,928 | B1 * | 4/2003 | Kobrin et al. ............... 216/22 |
| 2001/0021071 | A1 | 9/2001 | Krisko |
| 2001/0055702 | A1 | 12/2001 | Wang et al. |
| 2002/0012158 | A1 | 1/2002 | Smith et al. |
| 2002/0015131 | A1 | 2/2002 | Sato |
| 2002/0056864 | A1 | 5/2002 | Agarwal |
| 2002/0084513 | A1 | 7/2002 | Siniaguine |
| 2002/0113321 | A1 | 8/2002 | Siniaguine |
| 2002/0115290 | A1 | 8/2002 | Halahan et al. |
| 2003/0134510 | A1 * | 7/2003 | Lee et al. ................... 438/674 |
| 2003/0218140 | A1 * | 11/2003 | Tamamori et al. ....... 250/492.1 |

OTHER PUBLICATIONS

Grandinetti, "Oxidation/Reduction Reactions", http://www.chemistry.ohio-state.edu/~grandinetti/teaching/Chem121/lectures/Solution%20Re..c, May 21, 2002, pp. 1–5.

Nishi, Y., "Handbook of Semiconductor Manufacturing Technology," (2000), pp. 402–409.

Tomisaka, Manabu et al., "Electroplating Cu Fillings for Through–Vias for Three–Dimensional Chip Stacking", 2002 Electronic Components and Technology Conference, pp. 1432–1437.

http://chem.boisestate.edu/~rcbanks/inorganic/oxidation-reduction/activity_series.htm, (May 21, 2002), p. 1.

Learning Objectives, http://chem.boisestate.edu/~rcbanks/inorganic/oxidation-reduction/redox.htm, (May 21, 2002), pp. 1–6.

* cited by examiner

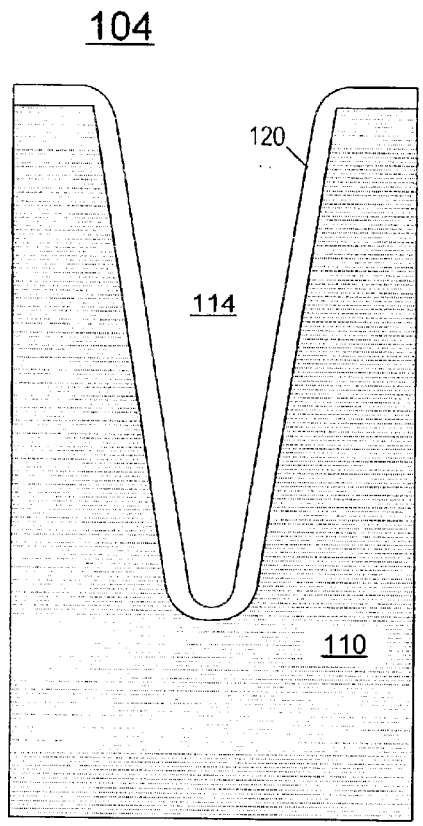
FIG. 4
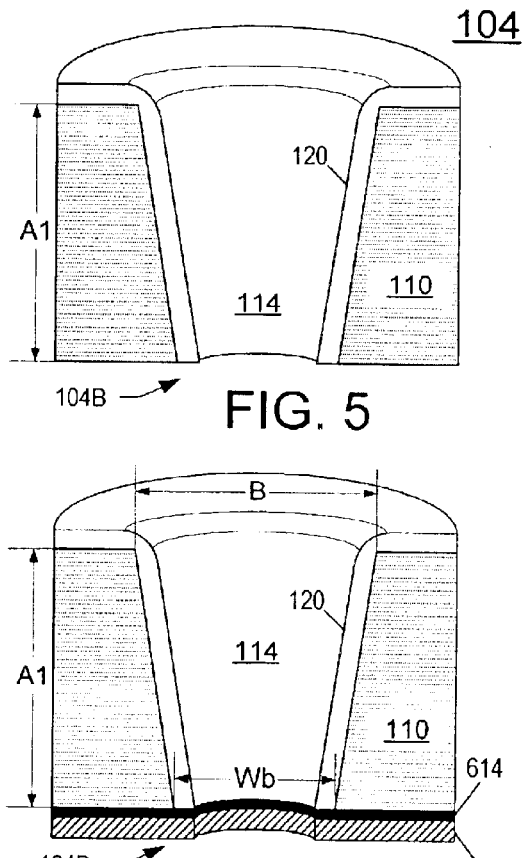
FIG. 5
FIG. 6
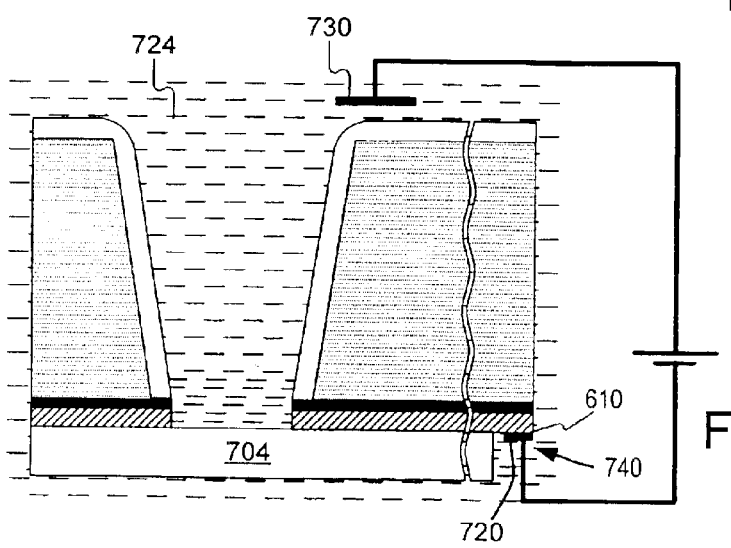
FIG. 7

ELECTROPLATING AND ELECTROLESS PLATING OF CONDUCTIVE MATERIALS INTO OPENINGS, AND STRUCTURES OBTAINED THEREBY

BACKGROUND OF THE INVENTION

The present invention relates to electroplating and electroless plating of conductive materials into openings. In some embodiments, the plated materials are used to form through hole interconnects in integrated circuits.

Fabrication of through hole interconnects in integrated circuits using electroplating has been described in U.S. Pat. No. 6,184,060 issued Feb. 6, 2001 to Siniaguine, and is illustrated in FIGS. 1 and 2. Wafer 104 includes a silicon substrate 110. The wafer has a face side 104F and a back side 104B. Openings 114 are etched in substrate 110 in the face side 104F. Dielectric 120 is deposited in the openings by chemical vapor deposition (CVD) or thermal oxidation. Metal 130 is sputtered on dielectric 120. Metal 140 is electrodeposited (electroplated) to fill up the openings.

Then the wafer is thinned by an etch of the back side 104B (FIG. 2). Dielectric 120 is exposed and attacked by the etch, and metal 130 becomes exposed. The exposed metal 130 provides backside contact pads that can be attached to another integrated circuit. Metal 140 increases the mechanical strength of the structure and improves heat dissipation.

SUMMARY

This section summarizes some features of the invention. Other features are described in the subsequent sections. The invention is defined by the appended claims.

Metal deposition by electroplating offers the advantages of high throughput and low tool cost. Electroless plating has similar advantages. The present invention provides fabrication processes involving electroplating or electroless plating of metal or other conductive materials into openings.

When metal is electroplated into an opening, the plating proceeds faster at the top edges of the opening, and the opening may close at the top before it is filled. The undesirable result is formation of voids in the electroplated metal. See U.S. Pat. No. 6,399,479 issued Jan. 4, 2002 to Chen et al., entitled "PROCESSES TO IMPROVE ELECTROPLATING FILL".

In some embodiments of the present invention, the electroplating operation is initiated at a distance from the top surface of the wafer but not over the opening's sidewalls adjacent to the top surface of the wafer. For example, in one embodiment, a through hole is formed in the wafer, and then a seed layer is sputtered on the bottom surface of the wafer. The through hole is open at the bottom during the seed layer deposition, but the seed layer is not deposited on the opening's sidewalls adjacent the top surface of the wafer. Therefore, the subsequent electroplating operation is not initiated adjacent the top surface. In the electroplating operation, the seed layer is connected to a cathode terminal of a power supply. The connection can be made at the edge of the wafer on the bottom surface of the wafer.

In another embodiment, an opening is formed in the top surface of the wafer. Then a dry film mask (e.g. dry film resist) is applied to the top surface and patterned to expose an inner portion of the opening in the wafer. Then the seed layer is deposited on the top of the wafer and into the opening. The edges of the dry film mask overhang the opening and do not allow the seed layer to be deposited over the opening's sidewalls adjacent the top surface of the wafer.

In another embodiment, the seed layer is deposited on the top surface of the wafer without a mask. Then another layer (a "first layer") is formed over the seed layer by a non-conformal deposition process, e.g. sputtering. The first layer covers the seed layer on the opening's sidewalls adjacent the top surface of the wafer, but does not cover the seed layer at a distance from the top surface of the wafer. The first layer does not allow the electroplating to be initiated over the sidewalls adjacent the top surface.

In some embodiments, the first layer is formed before the seed. Then the seed is deposited by electroless plating onto the semiconductor material at the bottom of the opening. The seed does not form on the first layer adjacent the top surface of the wafer.

Other embodiments and variations are described below.

The invention is not limited to formation of through hole interconnects in wafers that include semiconductor substrates. Some embodiments form through hole interconnects in dielectric substrates used for integrated circuit packaging (e.g. in ball grid array substrates), and in other bodies of material. Some embodiments are used to form contacts and interconnects in a dielectric layer formed over a semiconductor substrate (e.g. damascene interconnects). Other features of the invention are described below. The invention is defined by the appended claims.

BRIEF DESCRIPTION OF THE DRAWINGS

FIG. 4 is a cross sectional view illustrating one embodiment of the present invention.

FIGS. 5 and 6 each provide a perspective and cross sectional view illustrating one embodiment of the present invention.

FIGS. 7–27 are cross sectional views illustrating some embodiments of the present invention.

DESCRIPTION OF SOME EMBODIMENTS

Figure 3A:
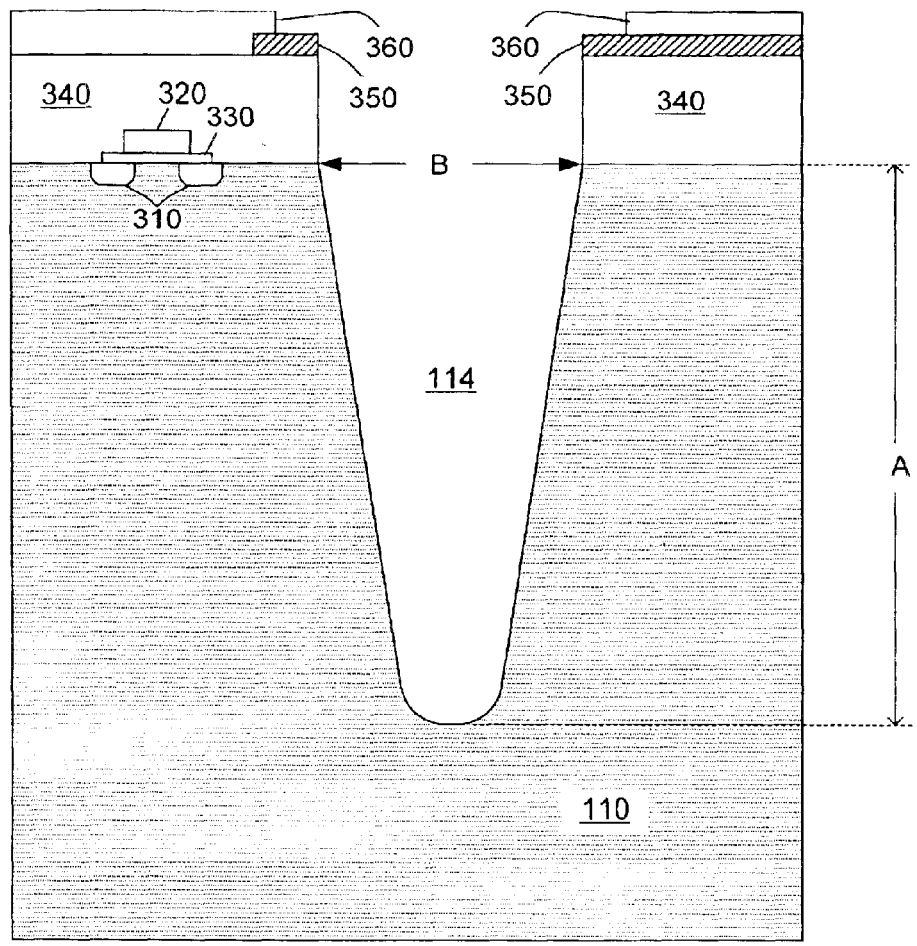
FIG. 3A is a cross sectional view illustrating one embodiment of the present invention.

FIG. 3A illustrates a cross section of a wafer 104. The wafer includes a semiconductor substrate 110. For illustration, it will be assumed that substrate 110 is made of silicon, although other semiconductor materials can be used. The invention is not limited to any materials, dimensions, or other details, but is defined by the appended claims.

Transistors, diodes, resistors, capacitors, interconnect lines, or other devices and circuits, or portions thereof, may have been formed in wafer 104. FIG. 3A shows a MOS transistor. Its source/drain regions 310 are doped regions formed in the top surface of substrate 110. Gate 320 is formed over the channel region located between the source/drain regions. Dielectric 330 insulates the gate from the channel region. A layer 340, which includes dielectric and conductive layers, has been formed over the substrate 110 and over the transistor. Conductive layer 350 (e.g. aluminum) has been formed over the layer 340 and patterned to provide a contact pad 350P (see the top view in FIG. 3B) and an interconnect 350C. Interconnect 350C connects the pad 350P to other circuit elements (not shown). Dielectric 360 has been deposited over the layer 350 and patterned to expose the contact pad.

This structure is exemplary and not limiting. We will assume for illustration that the top side of substrate 110 is an active side which contains active areas of transistors or other devices, but this is not necessary. The active areas and both active and passive devices can be formed anywhere in the wafer. In some embodiments, the wafer has no active areas. Also, any processing steps involved in fabrication of devices in the wafer can be postponed to a later stage or can be combined or intermixed with the steps forming the through hole interconnects. The elements 310, 320, 330, 340, 350, 360 are not shown in some of the figures.

Also, the terms "top" and "bottom" are used for convenience of description. The substrate and other structures discussed herein can be positioned with the "top" at the bottom or in any other orientation.

Figure 3B:
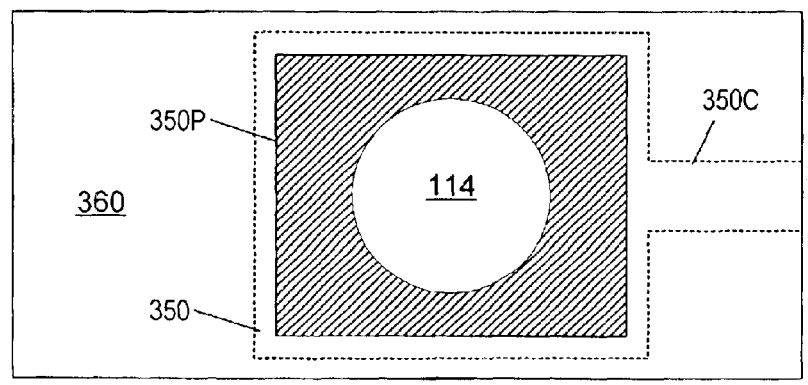
FIG. 3B is a top view of the structure of FIG. 3A.

Opening 114 is etched in the top surface of wafer 104 and substrate 110. If other layers (such as layer 340) have been formed over the substrate, these layers are removed at the location of the opening. In the example of FIGS. 3A, 3B, the opening goes through the pad 350P. A conductive material (e.g. copper) electroplated later into the opening can thus provide an interconnect between the pad and the wafer backside (in FIG. 3A, the backside is the bottom side). This structure is exemplary and not limiting.

Opening 114 does not go through substrate 110 at the stage of FIGS. 3A, 3B.

Opening 114 is shown as having sloped rounded sidewalls, but the sidewalls may be vertical, rounded or non-rounded, or have some other geometry. In FIG. 3A, opening 114 gets narrower towards the bottom, but in other embodiments the opening is wider towards the bottom, or the opening may have some other profile, known or to be invented. The opening may be round in top view (as in FIG. 3B), or rectangular, elongated (e.g. a trench), or of any other shape.

The opening may be formed by a masked etch, a laser, or in any other way known or to be invented. In one embodiment, a deep reactive ion etch (DRIE) is used, with the opening being defined by a photoresist or aluminum mask (not shown). DRIE may be followed by an atmospheric pressure plasma etch to widen the opening at the top relative to the bottom. A suitable etch is described in U.S. Pat. No. 6,184,060 issued Feb. 6, 2001 to Siniaguine, incorporated herein by reference. In another embodiment (FIG. 4), the opening is formed before the formation of layer 340 or any other layers on the top silicon surface. The opening is formed as follows. An aluminum layer (not shown) of about 1 $\mu$m thickness is deposited on the wafer. An infrared laser is used to drill a hole through the aluminum layer and then drill the opening 114 in silicon substrate 110 at the location of the hole. Silicon is melted during the laser drilling of the substrate, and is spluttered on the opening's sidewalls near the top of the substrate and on the aluminum layer. The top of the wafer is subjected to a fluorine containing plasma etch at atmospheric pressure (see e.g. U.S. Pat. No. 6,184,060). The plasma etch removes the spluttered silicon to smoothen the sidewalls. This etch also widens the opening, especially at the top, and smoothens the top edges of the opening. In some embodiments, the etching time is equal to the time that it would take to remove 3 to 5 $\mu$m of silicon from a planar silicon surface. The aluminum protects the top surface of substrate 110 during the laser drilling and the plasma etch, so the top surface remains smooth. The aluminum is then removed.

In one embodiment (see FIG. 3A), the opening depth A (measured from the top surface of substrate 110) is 150 $\mu$m, and the opening width B at the top of the substrate is 60 $\mu$m. Other similar openings may be formed in the wafer at the same time to form through hole interconnects.

Further processing will be described with respect to the structure of FIG. 4, though similar processing is appropriate for the structure of FIGS. 3A, 3B.

Dielectric layer 120 is formed over the substrate. We will assume for the sake of illustration that the dielectric 120 is silicon dioxide formed by thermal oxidation or chemical vapor deposition (CVD) to a thickness of 1 $\mu$m. Other materials (e.g. silicon nitride), and other dimensions and processes can also be used.

Then the wafer is thinned (FIG. 5). Silicon 110, and possibly other materials if present on the backside of wafer 104, are removed from the backside. Opening 114 becomes a through hole. The thinning can be done by mechanical or chemical-mechanical grinding or polishing, wet or dry etching, or possibly other techniques or combinations of techniques, known or to be invented. For example, a plasma etch can be used as described in the aforementioned U.S. Pat. No. 6,184,060, or mechanical grinding followed by a plasma etch. When the opening 114 becomes a through hole, dielectric 120 becomes exposed on the bottom. The dielectric is removed at the bottom, possibly by the same etch that etches the silicon 110, or by a separate etch. A hole is formed in dielectric 120 at the bottom of the wafer.

In some embodiments, before the wafer thinning, a protective layer (not shown) is formed on top of the wafer, possibly filling the opening 114, to protect the top surface of the wafer and the dielectric 120 on the sidewalls of the opening during the wafer thinning process. If the wafer is thinned by an atmospheric pressure fluorine plasma etch, the protective layer can be polyimide. In some embodiments, the protective layer is an adhesive tape deposited on top of the wafer, for example, a high temperature polyimide tape. The tape does not fill the opening 114, but the etch is terminated quickly after forming a hole in dielectric 120 at the bottom of the opening, so the dielectric removal from the sidewalls is minimized.

In one embodiment, the substrate 110 thickness A1=A-5 $\mu$m after the wafer thinning, where A is the initial depth of the opening (see FIG. 3A).

In the embodiment of FIG. 5, the wafer is not masked on the bottom during the backside etch, so the entire wafer is thinned. In another embodiment, the wafer thinning is replaced with a masked etch of the wafer backside. See e.g. U.S. patent application publication 2002-0113321-A1 published Aug. 22, 2002, incorporated herein by reference.

If a protective layer was used on top of the wafer during the backside etch, this layer is removed. A seed layer 610 (FIG. 6) is formed on the bottom surface of the wafer. For the sake of illustration, it will be assumed that the seed layer is copper sputter deposited to a thickness of 1 $\mu$m. Before the copper is deposited, a barrier layer 614 is formed on the backside surface of silicon 110 to prevent copper intermixing with silicon and promote copper adhesion. For the sake of illustration, we will assume that the barrier layer is titanium tungsten sputter deposited to a thickness of 0.2 $\mu$m. The invention is not limited to these dimensions and materials. Layer 614 can be dielectric, for example. Seed layer 610 can be any material consistent with the subsequent electroplating step. Additional conductive layers can be deposited before the seed layer 610 to provide a low resistance path from the cathode terminal 720 (FIG. 7) to the opening 114 in the electroplating operation. Opening 114 can be one of many openings in the wafer, and the low resistance will help to provide a uniform electrical potential at the openings.

The opening 114 widens from the bottom up, so substantially no copper 610 or TiW 614 is deposited over the sidewalls of opening 114. Some copper and TiW may be deposited over the sidewalls near the bottom of the opening. In one embodiment, the opening width B=60 μm at the top of the wafer (see FIG. 6), and at the bottom of the wafer the opening width Wb=10 μm. The opening width is measured between the silicon sidewalls. If the opening is round in top view, the opening width is the diameter of the opening. If the opening is square, the opening width is the length of a side or a diagonal. The opening's depth A1=145 μm at this stage. Other dimensions can also be used.

If the opening does not widen towards the top, some copper can be deposited on the sidewalls, but the copper can be restricted to a region below the top surface of substrate 110 because a sputtered copper layer can be deposited non-conformally. The aspect ratio A1/B can be increased not to allow the copper to reach the top surface of substrate 110. Also, the deposition angle can be made closer to 90° using known techniques such as a long throw reactor, collimated deposition, ionized deposition, or other techniques, known or to be invented. See for example "Handbook of Semiconductor Manufacturing Technology" edited by Y. Nishi et al. (2000), pages 402–409, incorporated herein by reference. See also the description below in connection with FIGS. 27–28. Other PVD techniques (e.g. evaporation) can also be used. Non-PVD techniques, known or to be invented, are also possible.

If the seed material is deposited at the top of the opening, it can be removed from the top by any suitable technique (e.g. a wet etch or de-plating). The seed material will not be entirely removed from the bottom of the wafer because the seed layer is thicker at the bottom.

A protective layer 704 (FIG. 7) is formed on seed layer 610 to prevent electroplating on the wafer backside. Layer 704 can be a spin-on or dry film resist compatible with the electroplating bath. A hole 740 is formed in layer 704 to expose the seed layer 610 at the edge of the wafer or at some other suitable location. Hole 740 allows the seed layer to be connected to cathode terminal 720. Hole 740 can be shaped as a ring extending along the periphery of the wafer, or the hole can be made by a needle-shaped cathode 720 piercing the layer 704. Other shapes and fabrication methods for hole 740 may also be possible. The wafer portion at which the seed layer is exposed will be discarded, so any material electroplated in the hole 740 area will not have to be separately removed.

The electroplating operation is performed in a suitable electroplating liquid 724. The anode terminal is schematically shown at 730 (the anode terminal can be as large as the wafer as know in the art.) Seed layer 610 is exposed in opening 114 at the bottom of the wafer. A conductive layer 810 (FIG. 8), for example, copper, is plated on layer 610. In some copper embodiments, the electroplating liquid 724 is $CuSO_4*5(H_2O)$ 250 g/L, $H_2SO_4$ 38 mL/L, Alcohol 10 mL/L, DI water, with other additives, e.g., bis (3-suflopropyl) disulfidesodium (SPS), Janus green B (JBG), HCl, and polyethylene glycol (PEG), as described in the paper by Tomisaka et al., "Electroplating Cu Fillings for Through-Vias for Three-Dimensional Chip Stacking", 2002 Electronic Components and Technology Conference, pp. 1432–1437, incorporated herein by reference. Resist 704 is type PM100/MM100/SF/NSF available from DuPont (United States), or ETERTEC series from Eternal (Taiwan). Other materials can also be used.

Layer 810 can be plated to any height. It can fill the opening partially or completely, and can protrude out of the opening on top of the wafer if desired. In the structure of FIGS. 3A, 3B, layer 810 can extend to contact pad 350P or to any other level.

Figure 8:
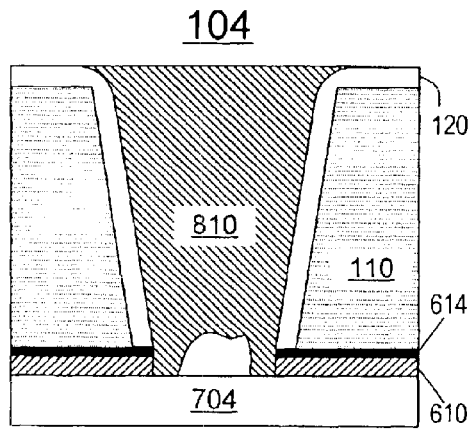

In the embodiment of FIG. 8, a void forms in layer 810 at the bottom of the wafer. Such voids can be avoided by controlling the plating bath. See the Tomisaka et al. article cited above.

Layers 704, 610, 614 are removed. In one embodiment, copper 610 and TiW 614 are removed by a wet etch. A suitable protective layer (not shown) is formed on top of the wafer before the etch of copper 610 to protect copper 810 at the top of the wafer. The protective layer also protects other elements (such as the elements 350, 360 in FIG. 3A) if present on top of the wafer. The protective layer can be photoresist, a grinding tape, or some other type, compatible with the etching process. A portion of copper 810 is removed at the bottom in the etch of copper 610.

Figure 1:
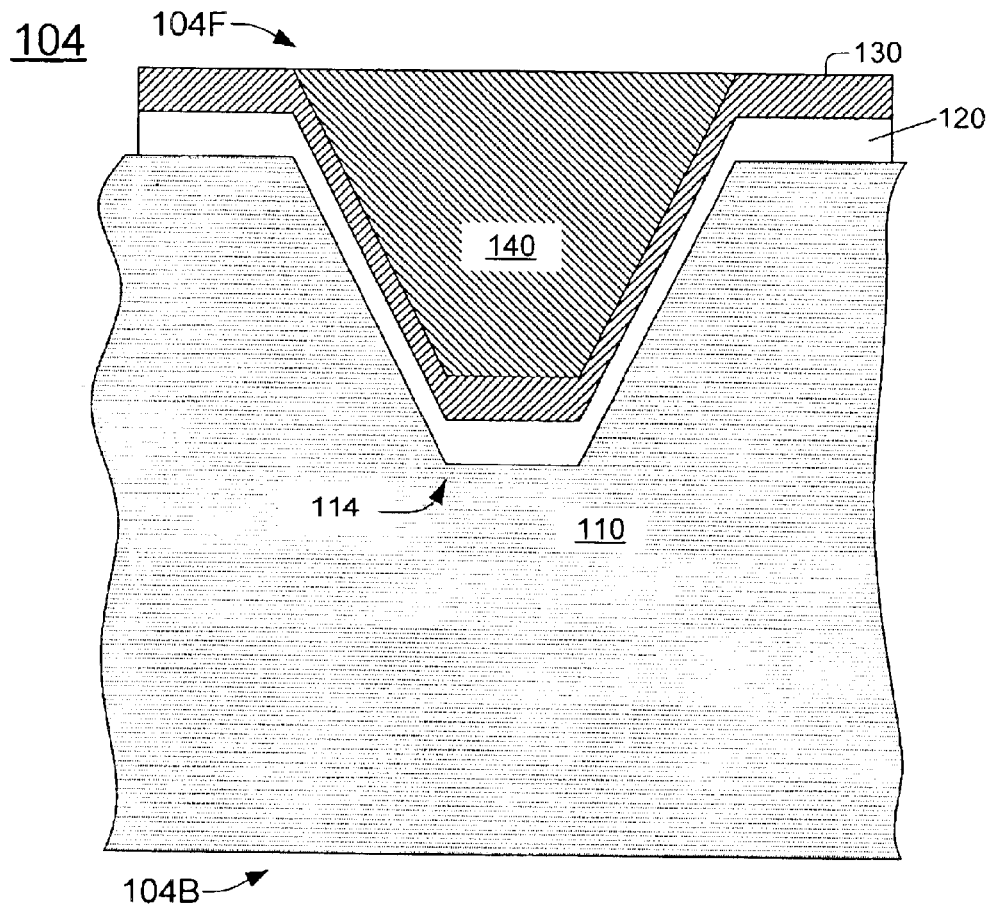
FIGS. 1 and 2 are cross sectional views of prior art integrated circuit structures.
Figure 2:
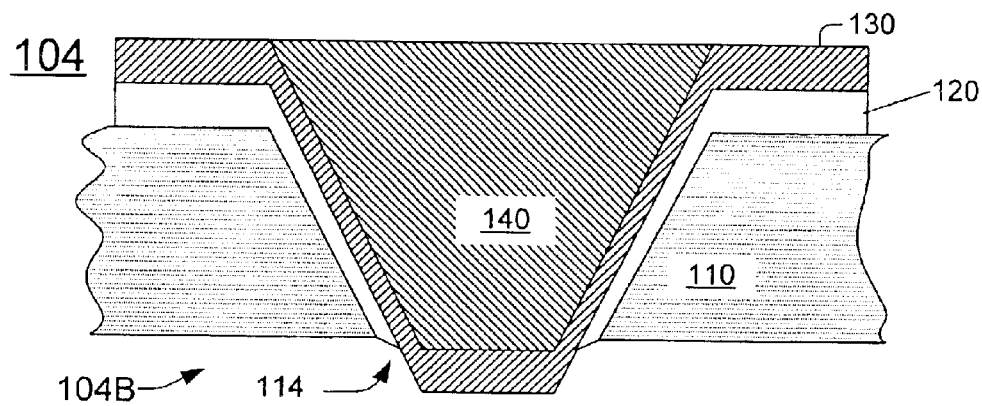
Figure 9:
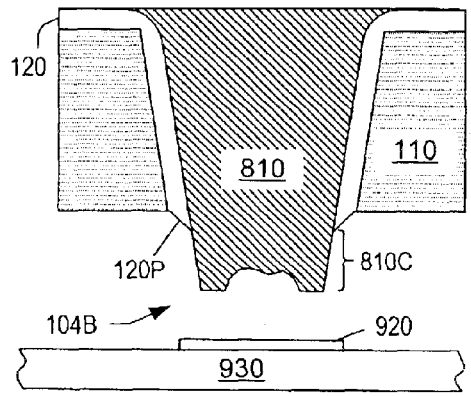

Then the wafer is thinned again (see FIG. 9). Silicon 110 is removed on the wafer backside 104B. Suitable thinning processes include the processes described above in connection with FIGS. 2 and 5. In one embodiment, a $CF_4$ atmospheric pressure plasma etch is used that etches silicon dioxide 120 slower than silicon 110. As a result, oxide 120 protrudes out of substrate 110 around the copper 810 at the bottom. The protruding portion of oxide 120 is marked as 120P. Copper 810 protrudes down farther than oxide 120 because the copper is not etched by $CF_4$. If desired, copper 810 can be etched by another reagent to obtain a smooth copper surface. In one embodiment, the etch is preceded by mechanical grinding to smoothen the bottom surface of layer 810 and planarize the bottom of the wafer. Then silicon 110 and oxide 120 are etched selectively to copper to obtain the profile shown in FIG. 9 (but with the smooth bottom surface of copper 810), with the copper protruding out of oxide 120 and the oxide protruding out of silicon 110. See U.S. patent application Ser. No. 09/792,311 filed on Feb. 22, 2001 by Halahan et al., published as no. 20020115290 on Aug. 22, 2002, entitled "SEMICONDUCTOR STRUCTURES HAVING MULTIPLE CONDUCTIVE LAYERS IN AN OPENING, AND METHODS FOR FABRICATING SAME", incorporated herein by reference. An additional dielectric layer (not shown) can be formed on the bottom surface of silicon 110, with layer 810 protruding out of this additional dielectric. This can be done without a mask. See the aforementioned U.S. patent application published as no. 20020115290, and see U.S. Pat. No. 6,322,903 issued Nov. 27, 2001 to Siniaguine et al., incorporated herein by reference. See also U.S. Pat. No. 6,184,060 issued Feb. 6, 2001 to Siniaguine; U.S. patent application Ser. No. 10/059,898 filed Jan. 28, 2002 by Siniaguine, published as no. 20020084513 on Jul. 4, 2002, which are incorporated herein by reference.

The protruding portion 810C of layer 810 on the bottom provides a contact area that can be bonded to a contact pad 920 on another substrate 930 (e.g. another wafer or die or a wiring substrate). The attachment is facilitated by the layer 810 protruding out on the bottom of the wafer. Dielectric 120 protrudes out of substrate 110 as noted above. This is desirable if the contact 810C is attached to contact pad 920 with solder or a conductive epoxy because the protruding dielectric 120 makes it more difficult for the solder or epoxy to short the contact 810C to silicon 110. Also, in the particular embodiment of FIG. 9, the entire protruding portion 120P of dielectric 120 becomes gradually thinner as it is traced down from substrate 110. As a result, the protruding dielectric is more flexible at the bottom, so the structure is less likely to be damaged if the contact 810C is pulled sideways. Contact 810C can be pulled sideways due to thermal expansion/contraction or during handling.

In one embodiment, instead of thinning the whole bottom surface of the wafer as described above, the silicon is removed from the bottom of the wafer with a masked etch. Then additional dielectric and conductive layers are formed on the wafer backside to redistribute the backside contacts so that the position of the backside contacts would not necessarily correspond to the position of openings 114. See the aforementioned U.S. patent publication 2002-113321-A1. The invention is not limited to any particular backside processing.

If opening 114 is formed by DRIE or with a laser, the opening's sidewalls can be rough. A 1 μm roughness is easily achievable, and a higher roughness is possible. The sidewalls of oxide layer 120 will also be rough. Consequently, layer 810 is anchored inside the opening 114. A good adhesion between the layers 810 and 120 is unnecessary.

Figure 10:
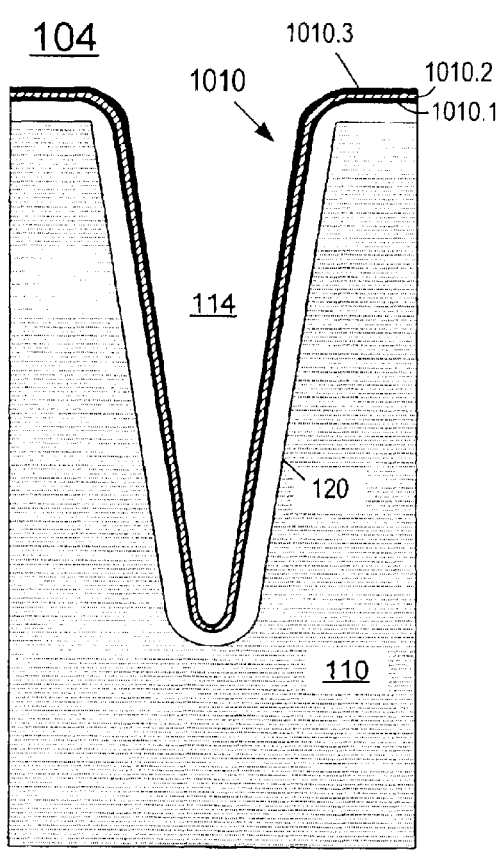

FIG. 10 illustrates an early stage of another through hole interconnect fabrication process. Opening 114 and dielectric 120 are formed as in FIGS. 3A–9 (layers 340 and other layers shown at the top of the wafer in FIG. 3A are not shown in FIG. 10, but such layers may be present in the structures of FIG. 10 or any subsequent figures unless indicated to the contrary). Then a conductive layer 1010 is formed over the wafer. Layer 1010 will deliver the electrical potential to the seed layer in the electroplating operation. The seed layer has not yet been formed. In FIG. 10, the conductive layer includes a barrier layer 1010.1 (e.g. TiW) formed on oxide 120, a high conductivity layer 1010.2 (e.g. copper) formed on layer 1010.1, and another layer 1010.3 (e.g. TiW) formed on layer 1010.2. In one embodiment, the three layers are formed by sputtering. The thickness of TiW 1010.1, copper 1010.2, TiW 1010.3 is respectively 0.2 μm, 1 μm, and 0.8 μm. In another embodiment, layer 1010.1 is TiW and layer 1010.2 is aluminum. Layer 1010.3 is omitted. Other materials, dimensions, and fabrication processes can also be used.

Dry film resist 1110 (FIG. 11A) is applied to the active side of the wafer. A hole is formed photolithographically in the resist over the opening 114. The edges of resist film 1110 overhang the opening. In one embodiment, the hole width HB is about ¼ of the opening width B at the top of the wafer (the width B is measured as in FIG. 3A or 6). The hole in the resist is centered over the center of opening 114.

Seed layer 610 is deposited on the active side of the wafer. In one embodiment, the layer 610 is copper formed by PVD (e.g. sputtering) to a thickness of about 100 Å. Seed layer 610 is deposited on the bottom and sidewalls of layer 1010 in opening 114, but layer 610 is not deposited on the top sidewall portions of layer 1010 near the top of the wafer due to the overhanging edges of resist 1110. The portion of layer 610 in the opening is thus below the top surface of the substrate 110. Layer 610 is also deposited on top of resist 1110.

Alternatively (see FIG. 11B), resist 1110 can be an electrophoretic photoresist applied to the wafer by electrodeposition. Conformal electrodeposition of electrophoretic resists (also called electrodepositable photoresists, or ED resists) is described in E. Boellard et al., "RF-Devices Realized in MEMS by Using Electrodepositable Photoresist", Delft University of Technology, The Netherlands (World Wide Web at http://www.stw.nl/programmas/safe/proc2000/boellaard.pdf). When the resist 1110 has been electrodeposited to a suitable thickness (e.g. 5 μm), the resist is patterned photolithographically so that a hole is formed in the resist layer at the bottom of opening 114. The upper portion of the opening's sidewalls is covered by the resist. Then layer 610 is deposited as in FIG. 11A.

In either case (FIG. 11A or 11B), the resist 1110 is stripped, together with any seed material 610 on top of the resist. Conductor 810 (FIG. 12), e.g. copper, is electroplated onto the seed 610 into the opening. In the electroplating operation, the cathode 720 contacts the layer 1010 on top of the wafer. TiW layer 1010.3 prevents electroplating on copper 1010.2.

Figure 13A:
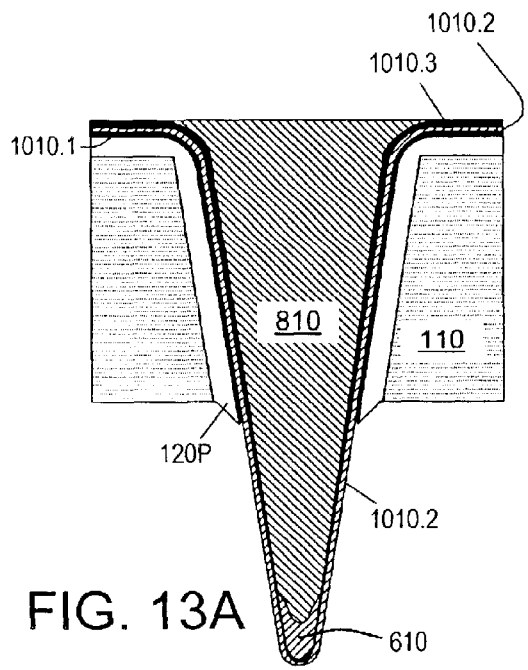

Then the wafer is thinned from the backside by any of the techniques described above in connection with FIG. 9. FIG. 13A shows the resulting structure in one embodiment. Dielectric 120 protrudes out of silicon 110 on the bottom (the protruding portion is shown as 120P). Metal layers 810, 1010.1, 1010.2 protrude out of dielectric 120. TiW layer 1010.3 was etched off at the bottom during the $CF_4$ etch of silicon 110 and oxide 120. Advantageously, the exposed copper 1010.2 is solderable (solder wettable), and can be readily soldered to a contact pad 920 (FIG. 9). The invention is not limited to solderable materials or solder attachments however.

Figure 13B:
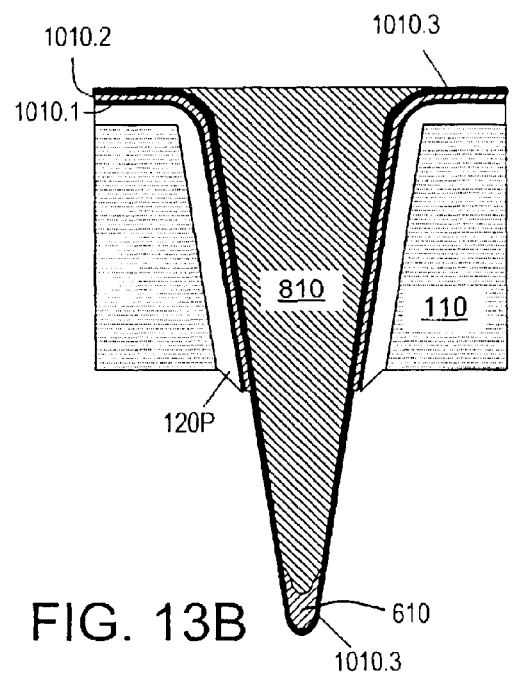

FIG. 13B shows an alternative structure obtained in the wafer backside processing. Metal 1010.2 may or may not be solderable, but it is removed at the bottom to expose the layer 1010.3. Layer 1010.3 is not all solderable but it includes a solderable sub-layer (e.g. nickel or gold). Part of layer 1010.3 is removed at the bottom to expose the solderable sub-layer.

Other backside processing can be performed as described above (e.g. additional dielectric can be formed on the wafer backside).

Figure 11A:
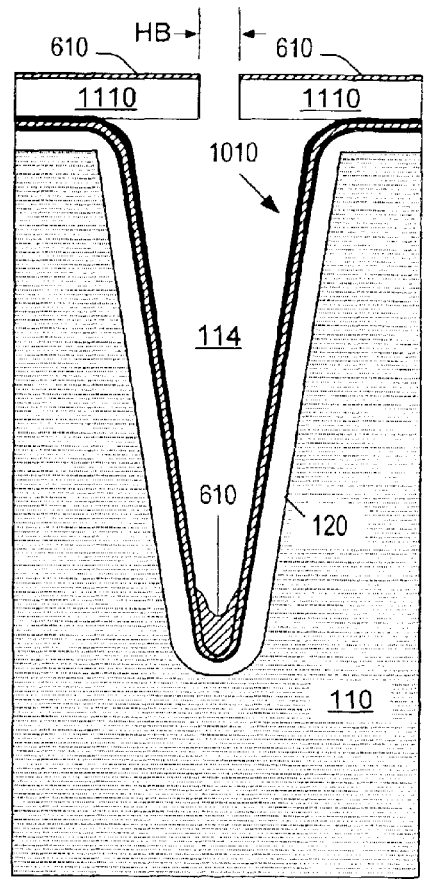
Figure 11B:
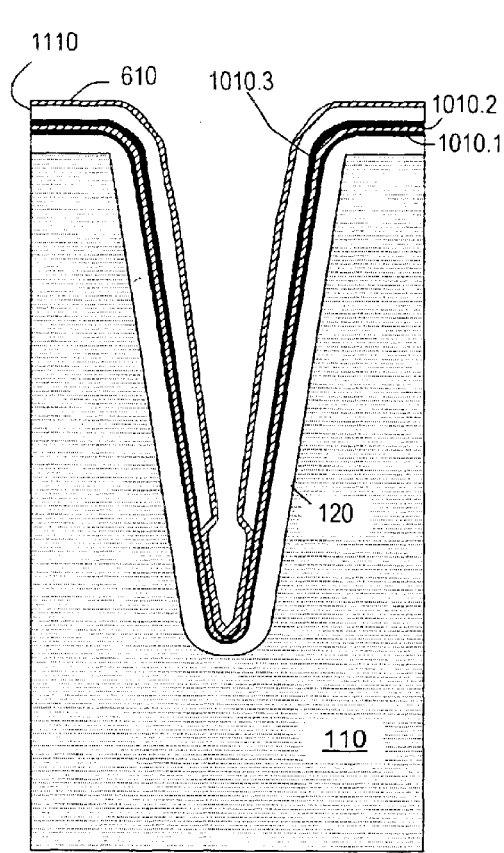
Figure 12:
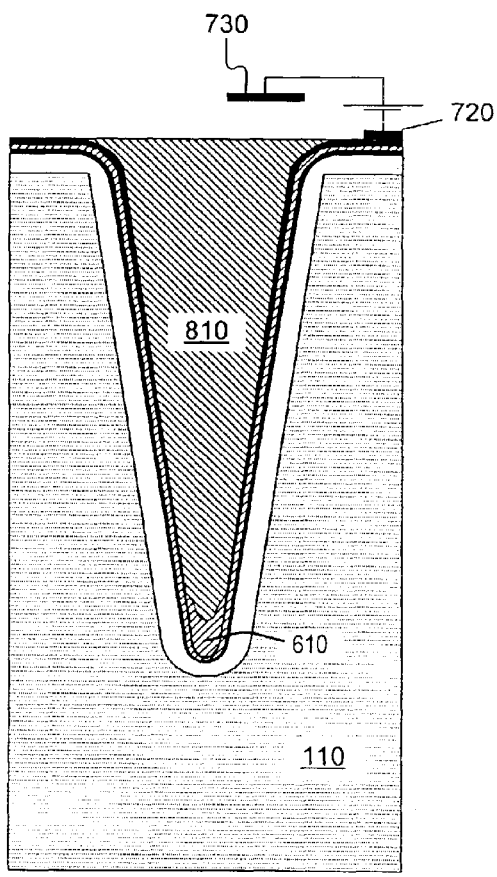
Figure 14:
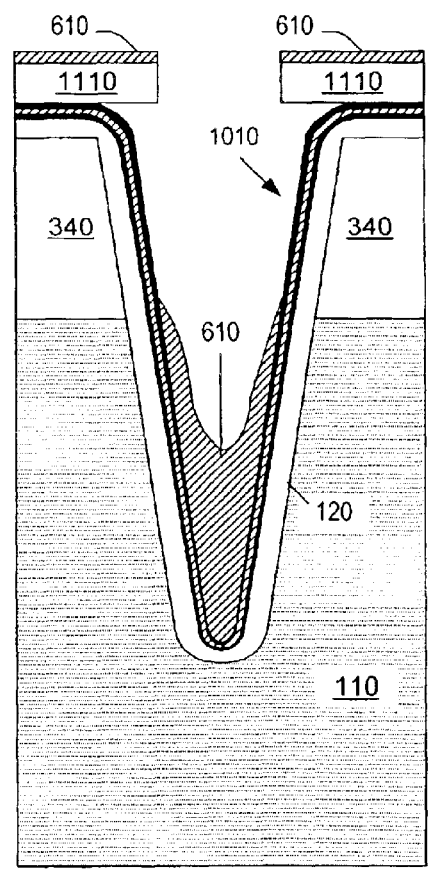

FIG. 14 illustrates a variation of the structure of FIG. 11A, with layers 340 shown. Seed layer 610 extends above the top surface of the substrate 110, but the seed layer is below the top surface of the wafer. A similar structure can be obtained for the case of FIG. 11B. From these stages, the processing can proceed as in FIGS. 12, 13A, 13B.

Figures 15, 16:
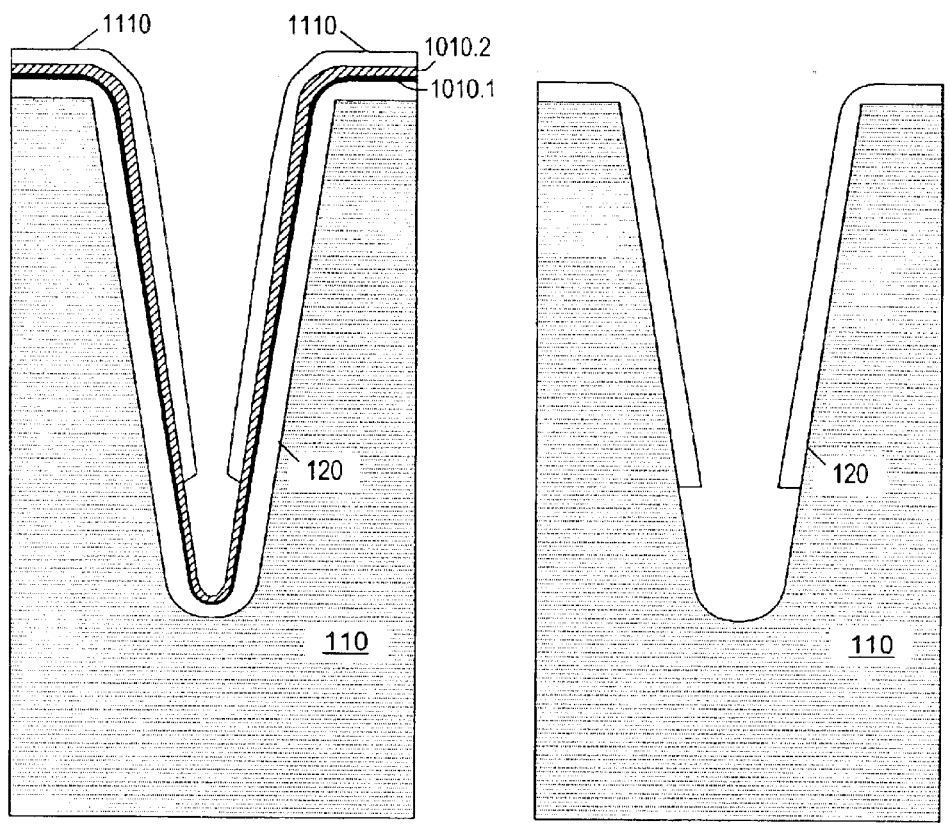

FIG. 15 illustrates another embodiment. Opening 114 and dielectric 120 are formed as in FIGS. 3A–14 (layer 340 and other layers shown at the top of the wafer in FIG. 3A are not shown in FIG. 15, but may be present). Then a seed layer is formed for the electrodeposition of ED resist 1110. In FIG. 15, the seed layer consists of two sub-layers 1010.1, 1010.2. The bottom layer 1010.1 is a 0.2 μm layer of TiW. The top layer 1010.2 is a 1 μm layer of copper. The copper provides a low resistance to obtain a uniform electrical potential across the wafer during the ED resist deposition. The TiW layer improves copper adhesion. Other materials and thickness values can also be used.

Then resist 1110 is conformally deposited to a suitable thickness (e.g. 5 μm) and patterned as described above in connection with FIG. 11B, to expose the seed layer 1010.2 at the bottom of opening 114.

Seed layers 1010.2, 1010.1 and dielectric 120 are etched away through the hole in resist 1110. Then the resist 1110 and the seed layers 1010.2, 1010.1 are stripped away. The resulting structure is shown in FIG. 16.

Figure 17:
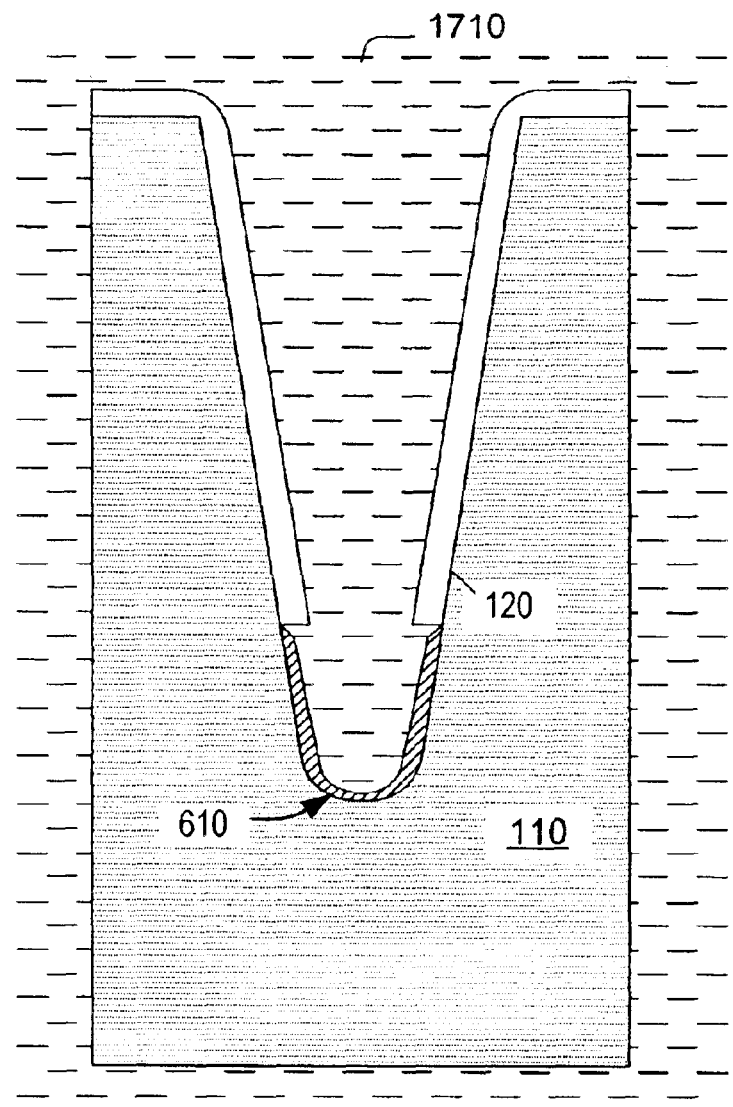

Metal 610 (FIG. 17) is selectively deposited onto the silicon surface at the bottom of the opening, and onto other exposed portions of substrate 110 (if any), by electroless plating in an appropriate liquid 1710. Dielectric 120 is exposed to liquid 1710, but metal 610 does not grow on dielectric 120. No mask is needed, though a mask can be used to protect the top side of the wafer outside of openings 114. In some embodiments, a mask (e.g. photoresist or dielectric, not shown) is formed on the wafer backside 104B to prevent the metal deposition on the backside. Alternatively, the wafer backside can be protected by a wafer holder (not shown).

Suitable metals 610 include nickel, titanium, cobalt, vanadium, and possibly others. Nickel can be plated on silicon in a plating solution available from Transene Company Inc. of Danvers, Mass. This process provides an ohmic contact between the nickel and the silicon 110. Other processes, known or to be invented, may also be suitable.

Metal 810 (FIG. 18) is deposited by electroless plating or electroplating in a plating liquid (not shown). Metal 610 serves as a seed. Metal 810 can be nickel, copper, aluminum, tin, titanium, tungsten, silver, gold, or some other metal, or combination of such metals. If electroplating is used, the cathode terminal 720 can be placed on the backside of substrate 110. Areas of substrate 110 can be doped to suitable conductivity to provide conductive paths between the cathode or multiple cathodes 720 and the metal 610. Since the bottom portion of substrate 10 will be removed during wafer thinning, it may be possible to dope the bottom portion without affecting the final structure.

In the plating operation, metal 810 preferentially grows from the bottom of the opening. Therefore, the opening is less likely to close on the top during the deposition, so the formation of voids in metal 810 is less probable.

Metal 810 can be formed to fill the opening. The wafer will have a substantially planar top surface. Alternatively, metal 810 can be deposited to fill the opening only partially, or on the contrary to overfill and protrude from the opening, as desired.

The wafer backside is processed to expose the metal 610 and/or 810 at the bottom. The backside processing can be performed by the techniques described above in connection with FIGS. 1–13B.

FIGS. 19–25 illustrate another embodiment. Wafer 104 is processed to manufacture circuit elements as needed. Then the wafer is thinned. Then dielectric 2010 and conductive layers 2020, 2030 are formed on the wafer backside 104B. We will assume for illustration that the dielectric 2010 is silicon dioxide deposited on silicon 110 by thermal oxidation or CVD to a thickness of 8000 Å; layer 2030 is copper deposited by sputtering to a thickness of 1 to 2 $\mu$m, and layer 2020 is an adhesion promotion layer of TiW sputtered on oxide 2010 to a thickness of 0.1 to 0.2 $\mu$m. Layer 2030 will be used to deliver the electrical potential for the electroplating operation. Oxide 2010 will prevent the electroplating current from spreading into the silicon 110. Layers 2010, 2020 are optional.

Figure 20:
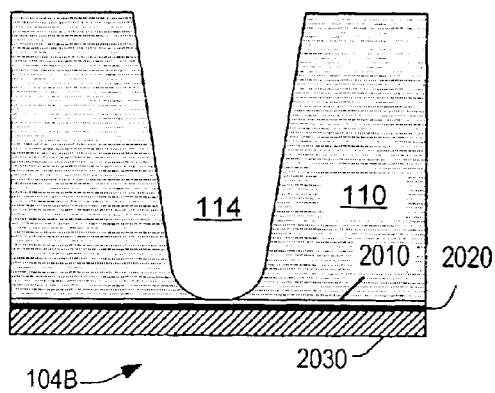
Figure 21:
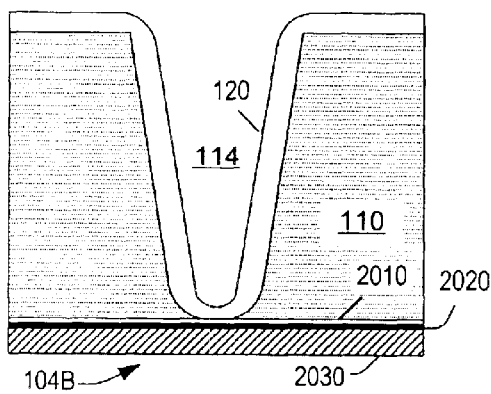

Opening 114 (FIG. 20) and other similar openings are formed by any of the techniques described above in connection with FIGS. 3A–14, or by some other techniques. In FIG. 20, the opening etch stops on oxide 2010. In other embodiments, the opening may terminate above the bottom surface of silicon 110.

Silicon dioxide 120 (FIG. 21) or another suitable dielectric is formed over the top side of the wafer as described above in connection with FIG. 4, to cover the sidewalls of opening 114.

Then a hole 2210 (FIG. 22) is formed in oxide layers 120, 2010 at the bottom of opening 114 to expose the layer 2020.

Figure 22:
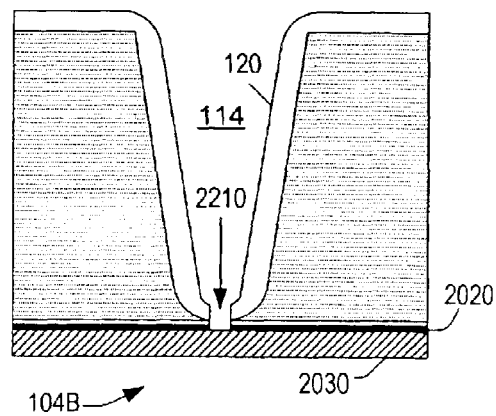

In FIG. 22, the hole 2210 goes through the TiW layer 2020 to expose the copper 2030. The hole can be made by a laser. In one embodiment, the laser is Model T-series, T-40-Y70-106Q available from Spectra-Physics Lasers, Inc. (United States). The hole can also be made by an etch. The etch can be a masked etch using a masking layer (not shown). Alternatively, layer 120 can be patterned using an ED resist described above. Before the ED resist is electrodeposited, a conductive layer is formed on dielectric 120 to serve as a seed for the resist deposition. In one embodiment, the conductive layer includes a barrier layer of TiW and a layer of copper. Copper is suitable for providing a uniform potential across the wafer during the resist deposition. The resist and the conductive layer are removed when the hole 2210 has been formed.

As noted above, the etch of opening 114 (FIG. 20) may terminate above the bottom surface of silicon 110. In such embodiments, some silicon 110 is removed when the hole is being formed to expose the copper 2030.

Dry film resist 2404 (FIG. 23A) is applied on the active side of the wafer. A hole is formed in the resist film over the opening 114. The edges of the resist film overhang the opening.

Figure 23A:
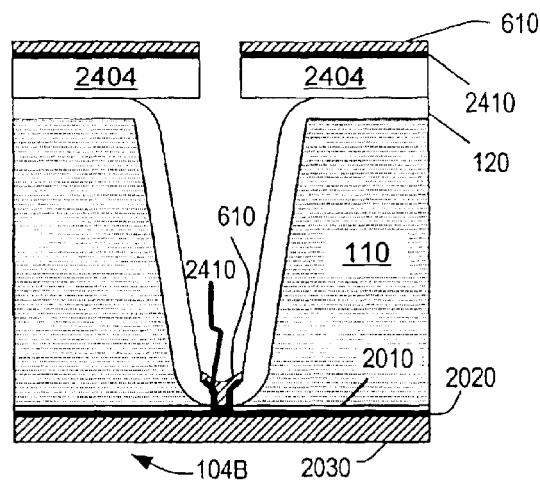
Figure 23B:
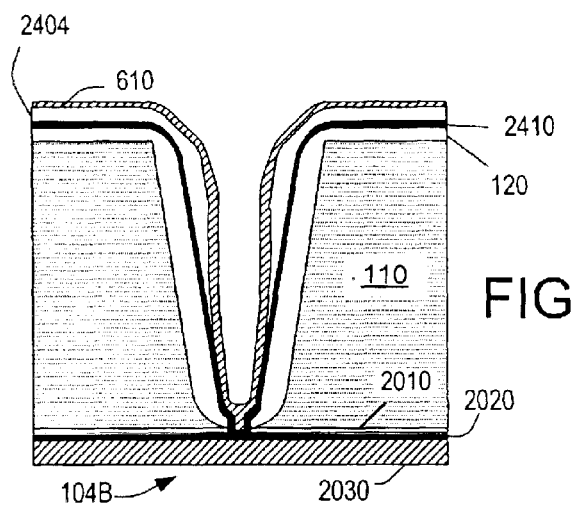

Adhesion promoting layer 2410 (optional) and seed layer 610 are formed over the active side of the wafer. In one embodiment, layer 2410 is a 0.1 $\mu$m thick layer of TiW, and layer 610 is a 0.1 $\mu$m thick layer of copper, both formed one after the other by PVD (e.g. sputtering) without breaking the vacuum. Both layers are present on the bottom and sidewalls of oxide 120 in opening 114. These layers are below the top surface of the wafer. In FIG. 23A, the layers 2410, 610 are below the top surface of substrate 110, but this is not necessary. Copper 610 is shown completely covering the TiW 2410, but this is not necessary.

In another variation (FIG. 23B), resist 2404 is a conformal electrophoretic resist layer. A conductive layer 2410 is deposited before the resist 2404 to serve as a seed for the electrodeposition of resist 2404. In one embodiment, layer 2410 consists of a bottom layer of TiW, a middle layer of copper, and a top layer of TiW (similar to the layer 1010 in FIG. 10). The middle layer of copper serves to provide a uniform potential across the wafer for the resist deposition. The bottom TiW is an adhesion promoting layer. The top TiW serves to prevent electrodeposition of copper 810 on top of the wafer during the subsequent step explained below in connection with FIG. 24. When resist 2404 has been deposited, it is patterned photolithographically to form a hole at the bottom of opening 114. Then copper 610 is deposited. If desired, another adhesion promoting layer (e.g. TiW, not shown) can be deposited after forming the hole in resist 2404 before depositing the copper 610. Materials other than copper can be used for layer 610.

Figure 24:
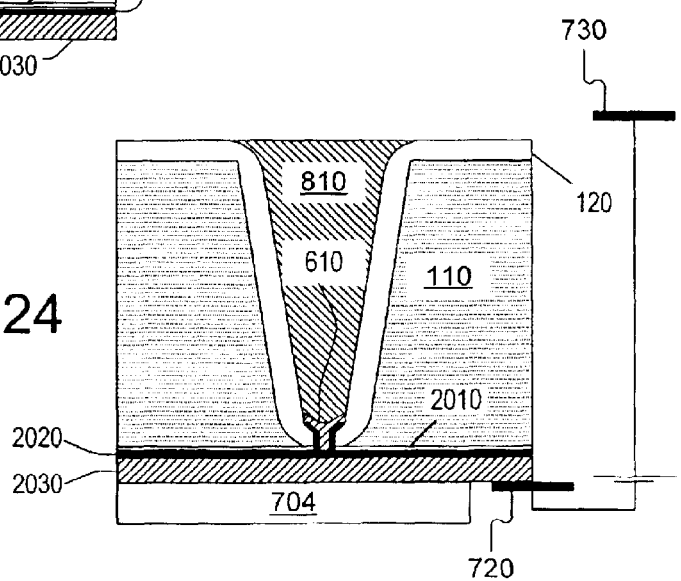

FIG. 24 illustrates further processing for the embodiment of FIG. 23A. The same or similar processing steps can be used for the case of FIG. 23B. Resist 2404 is removed, together with the portions of layers 2410, 610 that may have been deposited on top of the resist. A protective layer 704, e.g. photoresist or TiW, is formed on copper layer 2030 to prevent electroplating on the wafer backside, as described above in connection with FIG. 7. A hole is formed in layer 704 to expose the layer 2030 at the edge of the wafer or at some other suitable location if layer 704 is not conductive. Cathode terminal 720 is connected to copper 2030 in the hole, or to layer 704 if this layer is conductive. Copper 810 (or some other material) is electroplated on layer 610 into the opening 114. See the description above in connection with FIG. 7.

If the electroplating cannot be performed on the material of layer 2030 (e.g. layer 2030 is aluminum), the protective layer 704 can be omitted.

Figure 25:
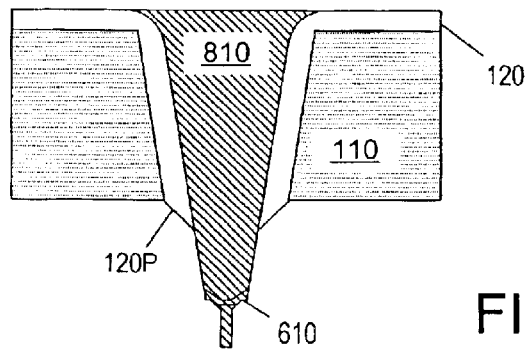

Layers 704, 2030, 2020, 2010 are removed. The wafer is thinned by a technique such as described above in connection with FIGS. 1–14. TiW layer 2410 can be removed from the wafer backside. FIG. 25 shows the resulting structure, with a protruding oxide portion 120P. Copper layers 610, 810 protrude down farther than the oxide. Other profiles are also possible. Other backside processing can be performed as described above (e.g. a masked etch of the silicon can replace the blanket wafer thinning etch, additional layers can be formed on the backside).

Figure 26:
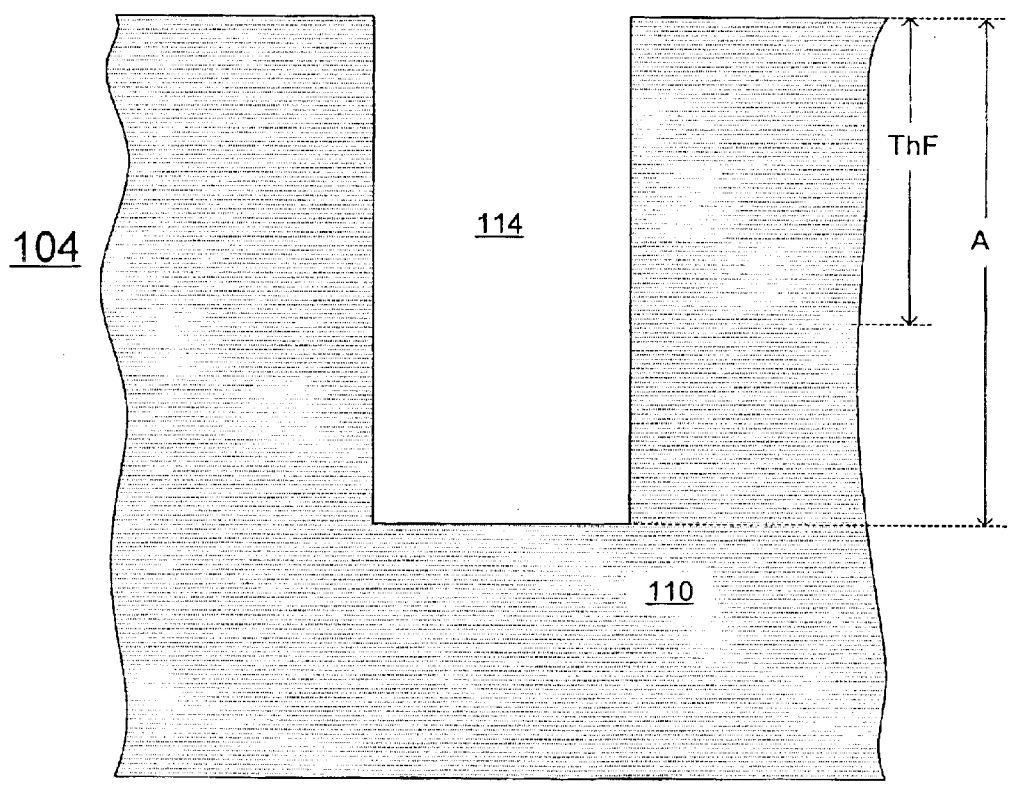

Now another fabrication process will be described. Opening 114 (FIG. 26) is formed in substrate 110 as in FIGS. 3A, 3B, 4. In FIG. 26, opening 114 has vertical sidewalls, but this is not necessary.

Dielectric layer 120 (FIG. 27) is deposited on the top surface of substrate 104 by physical vapor deposition (PVD). Dielectric 120 can be silicon nitride, silicon dioxide, aluminum oxide ($Al_2O_3$), or some other dielectric. A number of PVD techniques can be used, including sputtering, evaporation, or other techniques, known or to be invented. For example, silicon nitride can be formed by sputtering from a silicon target 2810 in a nitrogen atmosphere.

Due to the non-conformal step coverage, dielectric 120 is not deposited on the bottom surface of opening 114. Silicon 110 remains exposed on the bottom surface, and possibly on the sidewalls near the bottom, even if the layer 120 is not patterned in opening 114 (i.e. one does not need to perform a masked etch of dielectric 120 to remove the dielectric 120 from the bottom of opening 110). Layer 120 can optionally be patterned outside of opening 114.

Figure 30:
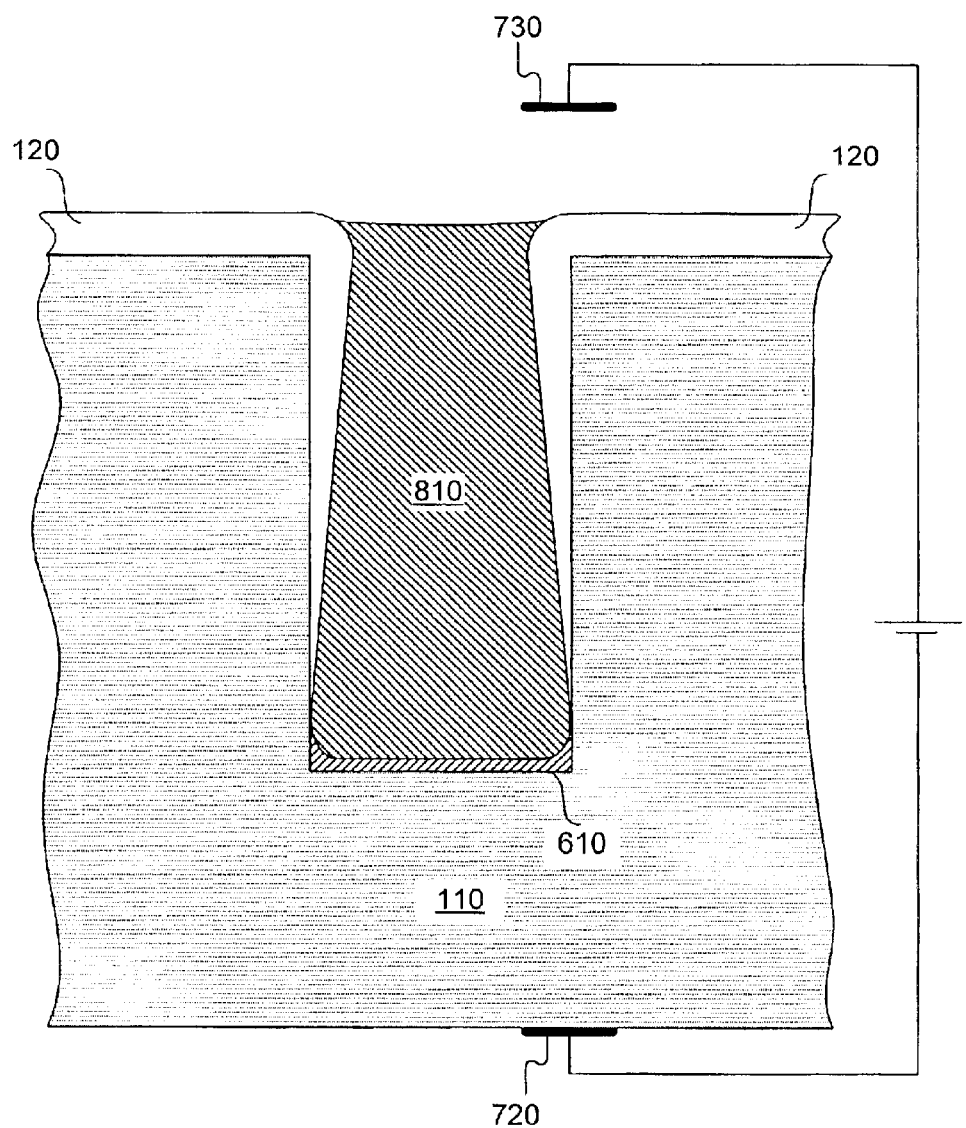

Dielectric 120 is continuous from the top of substrate 110 down to some depth C which is at least as large, and possibly larger, than the final substrate thickness ThF (after thinning). The minimal thickness W of dielectric 120 on the sidewalls through the depth ThF is sufficient to insulate the substrate 110 from metal 810 (FIG. 30) to be subsequently plated into the opening.

To ensure that the dielectric 120 is not deposited on the bottom of the opening, one can adjust the opening's width B and depth A. The width B can be made small, and the depth A can be made large, to provide a high aspect ratio. In some embodiments in which the opening has vertical sidewalls, A=150 $\mu$m, B=60 $\mu$m, and ThF=100 $\mu$m. In some embodiments, dielectric 120 is 1 $\mu$m thick on top of the wafer, and the width W is 0.2 $\mu$m.

Figure 28:
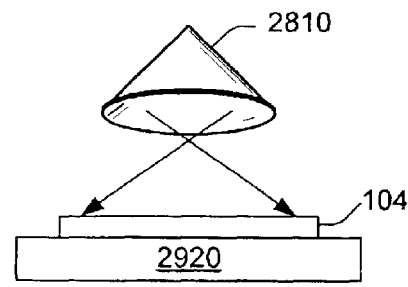
FIG. 28 is a side view of a physical vapor deposition system used in one embodiment of the present invention.

The molecules of dielectric 120 approach the wafer at some incident angles $\alpha$. (The molecules' trajectories are shown by arrows.) To avoid deposition on the bottom of opening 114, the angles $\alpha$ should preferably be greater than some minimal angle $\alpha 0$. One technique believed to increase the angles $\alpha$ consists in using a conical target 2810 (FIG. 28). PVD systems using conical targets are available from Sputtered Films, Inc. of Santa Barbara, Calif.

FIG. 28 also illustrates a pedestal 2920 supporting the wafer 104 during deposition.

Another technique for increasing the angles $\alpha$ involves placing the wafer farther from the target so that the molecules of dielectric 120 that travel at angles smaller than $\alpha 0$ will be unlikely to reach the wafer (a "long throw" PVD system). In another embodiment, a collimator is placed between the target and the wafer to catch the molecules moving at angles smaller than $\alpha 0$. These techniques are described in "Handbook of Semiconductor Manufacturing Technology" edited by Y. Nishi et al. (2000), pages 402–404, incorporated herein by reference. Different techniques can be combined, and other techniques, known or to be invented, can also be used.

Figure 29:
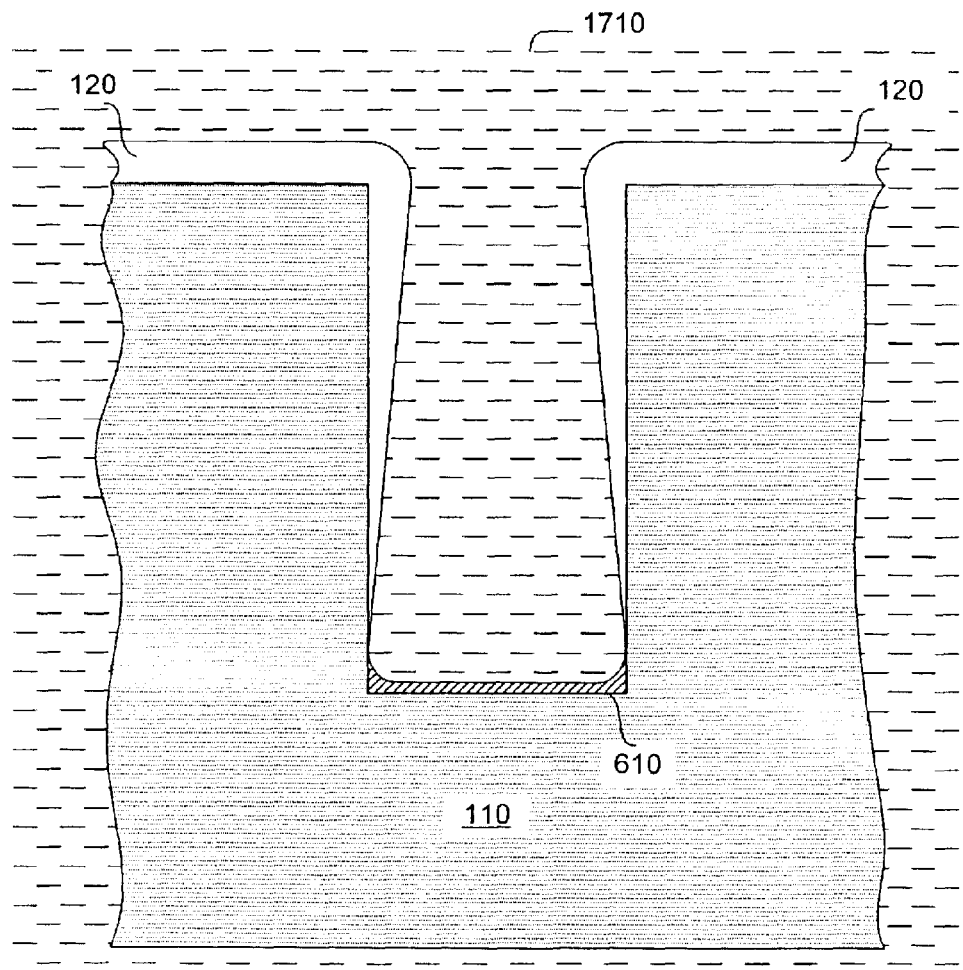
FIGS. 29–42 are cross sectional views illustrating some embodiments of the present invention.

In some embodiments, dielectric 120 gets to the bottom of opening 114 but does not cover all of the silicon on the bottom. Some silicon remains accessible for electroless plating of metal 610 (FIG. 29). Further, before the deposition of metal 610, the dielectric 120 can be subjected to a blanket etch to remove the dielectric from the bottom of the opening but leave a sufficient thickness of dielectric 120 on the sidewalls of the opening through the depth ThF. A short wet etch may be appropriate. A mask can be used to protect the dielectric outside of the opening.

Metal 610 (FIG. 29) is selectively deposited onto the silicon surface at the bottom of the opening, and onto other exposed portions of substrate 110 (if any), by electroless plating in an appropriate liquid 1710, as described above in connection with FIG. 17. Dielectric 120 is exposed to liquid 1710, but metal 610 does not grow on dielectric 120. No mask is needed, though a mask can be used to protect the top side of the wafer outside of openings 114. In some embodiments, a mask (e.g. photoresist or dielectric, not shown) is formed on the wafer backside 104B to prevent the metal deposition on the backside. Alternatively, the wafer backside can be protected by a wafer holder (not shown).

Figure 18:
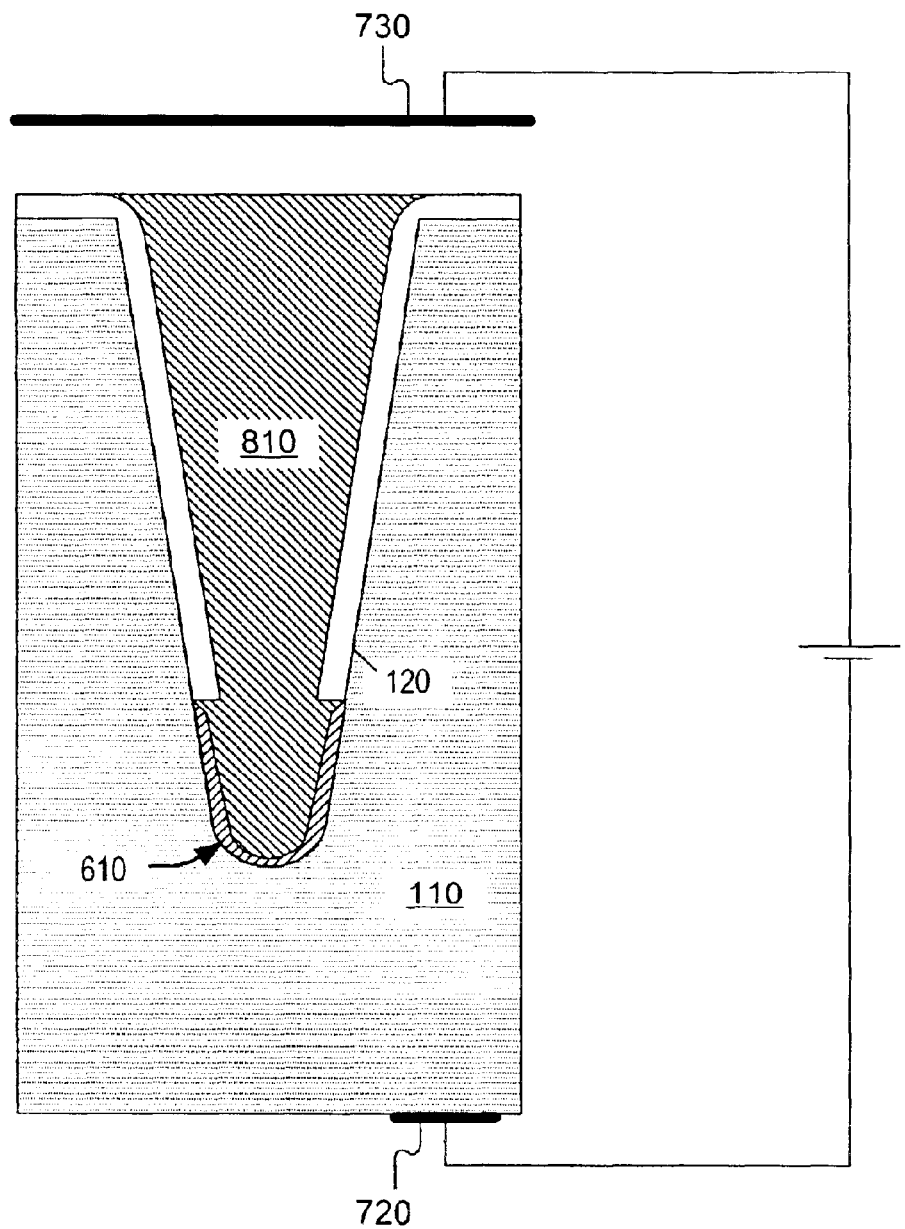
Figure 19:
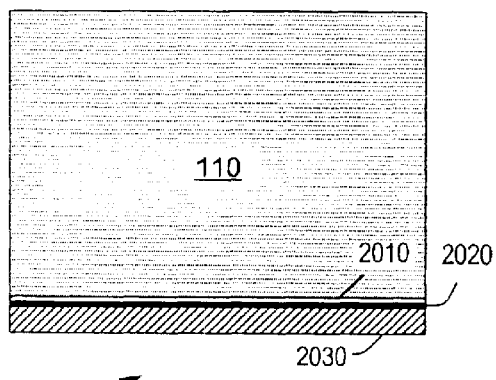

Metal 810 (FIG. 30) is deposited by electroless plating or electroplating in a plating liquid (not shown), as in FIG. 18. Metal 610 serves as a seed. If electroplating is used, the cathode terminal 720 can be placed on the backside of substrate 110.

Metal 810 can be formed to fill the opening. The wafer will have a substantially planar top surface. Alternatively, metal 810 can be deposited to fill the opening only partially, or on the contrary to overfill and protrude from the opening, as desired.

Layer 810 can be a conductive non-metal layer.

In some embodiments, layers 610 and 810 are a single layer deposited in a single electroless plating or electroplating operation.

Figure 31:
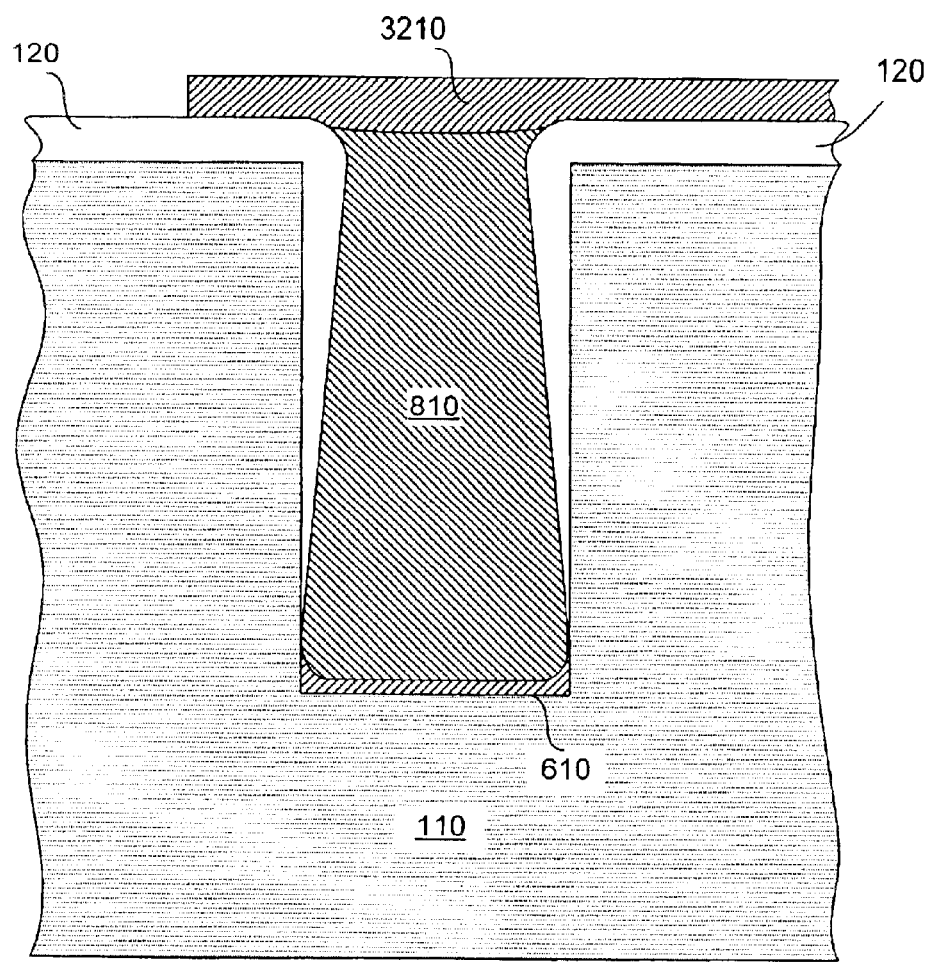

Other layers are formed as needed to fabricate desired circuitry. In the example of FIG. 31, a conductive layer 3210 is deposited and patterned to connect the metal 810 to other circuit elements (e.g. transistor elements 310, 320 shown in FIG. 3A).

Figure 32:
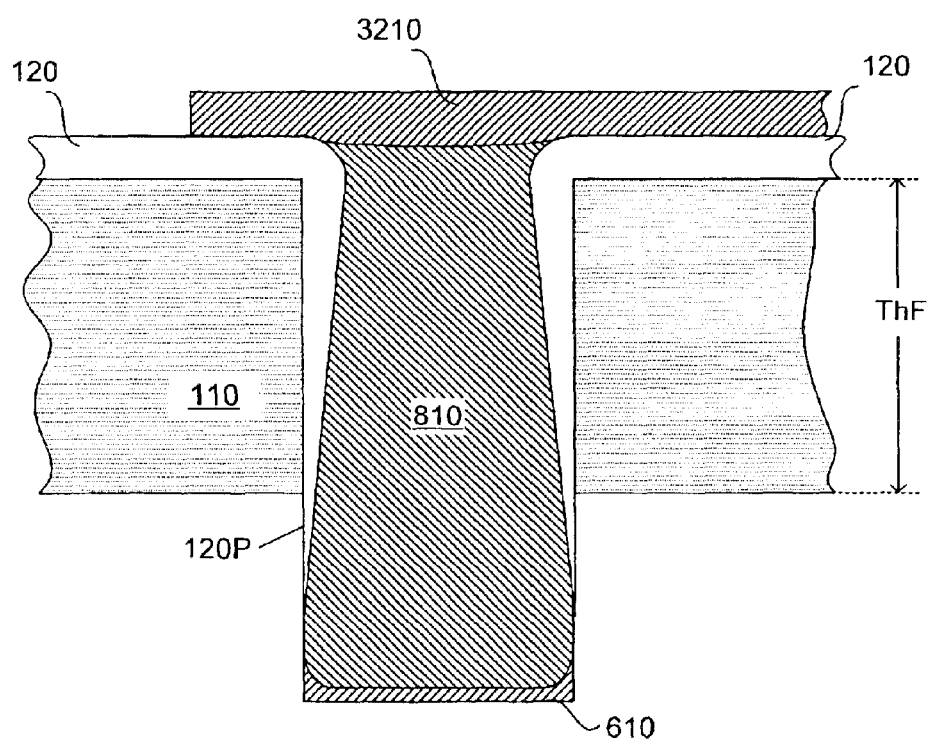

Then the wafer is thinned from the backside (FIG. 32) by any of the techniques described above in connection with FIGS. 9, 13A, 13B, 25. In FIG. 32, metal 610 is not removed in the thinning operation. Some or all of metal 610 is removed in other embodiments. Metal layer 610, 810 protrude on the bottom. Dielectric 120 also protrudes on the bottom but not as far as metal layers 610, 810. The entire protruding portion 120P of dielectric 120 becomes gradually thinner as it is traced down from substrate 110. Other backside processing can be performed as described above in connection with FIGS. 9, 13A, 13B, 25 (e.g. additional dielectric can be formed on the backside, etc.).

In some embodiments, layer 610 is solderable, e.g. gold, silver, copper, tin, lead, or their combinations or alloys. If layer 610 is not solderable, layer 810 may include two or more sub-layers with the bottom sub-layer being solderable. For example, layer 610 can be titanium, cobalt, or vanadium, and layer 810 can include a thin layer of gold or silver as the bottom sub-layer, and may also include another metal, e.g. aluminum or tungsten, as the upper sub-layer. Layer 610 can be removed during or after the wafer thinning. The bottom sub-layer of layer 810 will protrude out of dielectric 120. In some embodiments, layer 810 includes more than two sub-layers. If the bottom sub-layer or sub-layers are not solderable, the bottom sub-layer or sub-layers are removed during or after the wafer thinning to expose a solderable sub-layer.

Figure 33:
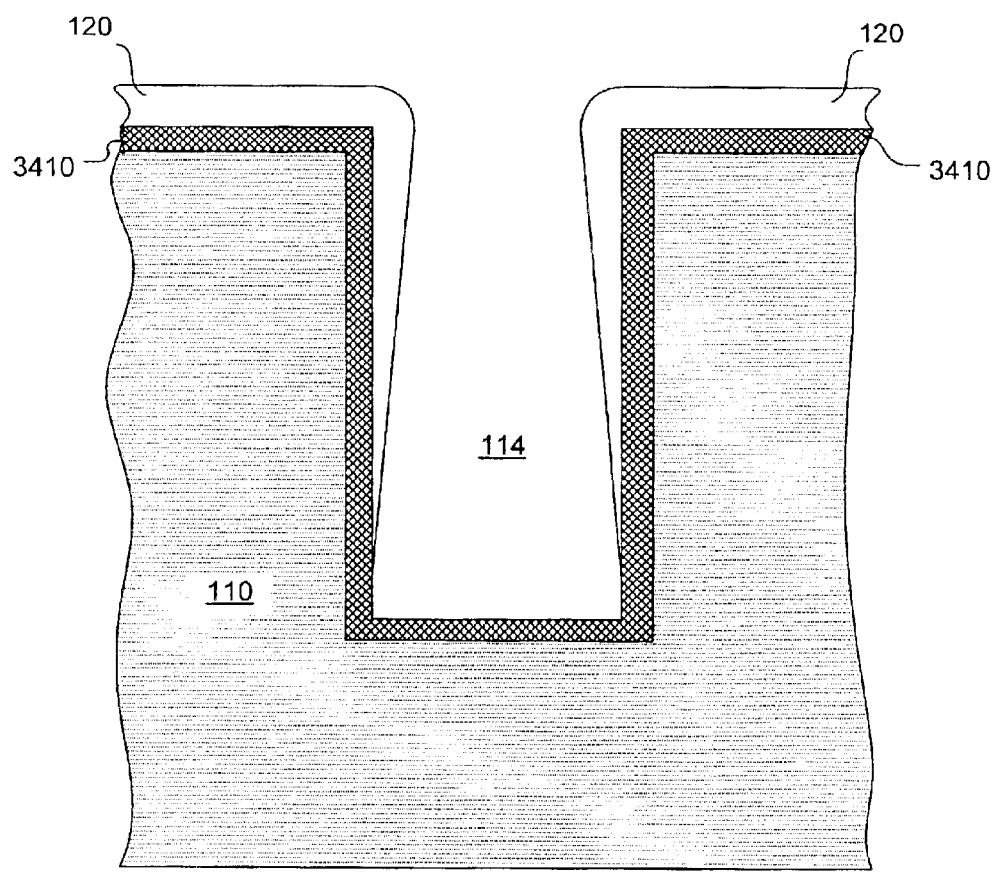

In FIG. 33, a dielectric 3410 is formed on the silicon surface of opening 114 before the layer 120 deposition. Dielectric 3410 may or may not cover the bottom of opening 114. In particular, dielectric 3410 can be a conformal layer. In some embodiments, dielectric 3410 is silicon dioxide formed by CVD or thermal oxidation to a suitable thickness, e.g. 1 μm.

Then layer 120 is deposited by PVD as described above in connection with FIG. 27. Dielectric 3410 is exposed on the bottom of opening 114 and possibly on the sidewalls near the bottom. If layer 120 forms on the bottom of the opening, the layer 120 can be removed from the bottom by a masked or blanket etch as described above in connection with FIG. 27.

Figure 34:
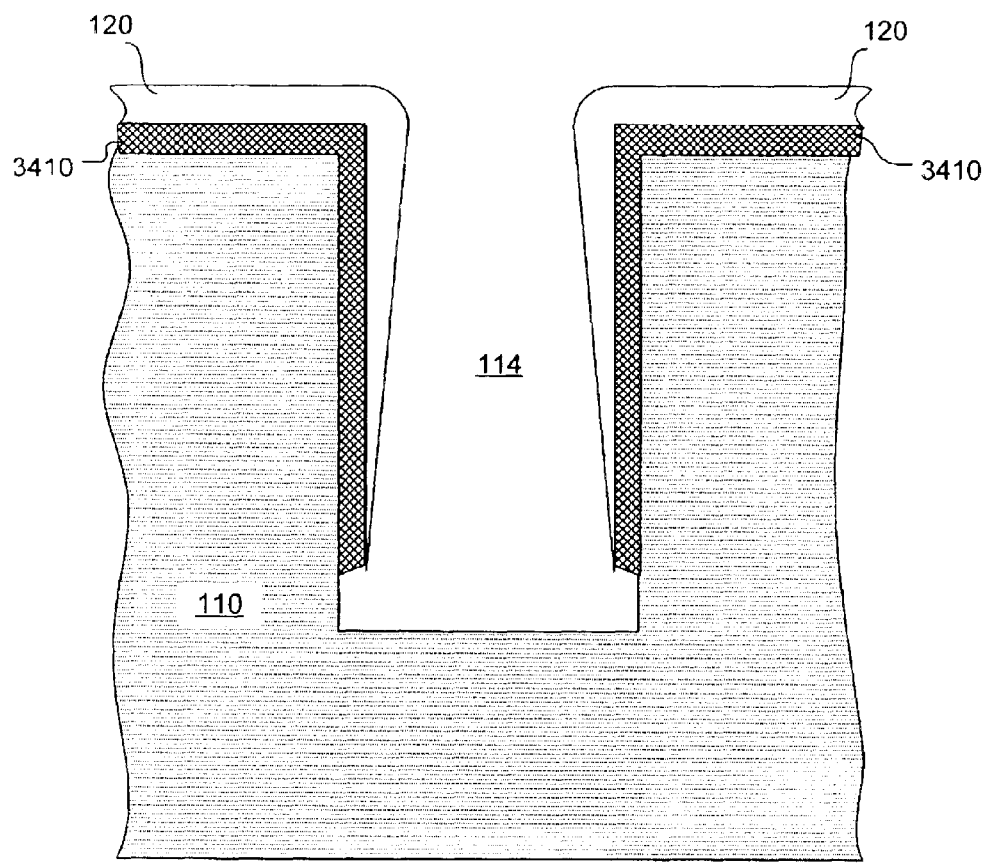

Layer 120 can be any material, not necessarily dielectric, that can be used as a mask for patterning the layer 3410. Layer 3410 is etched away at the bottom of opening 120, and possibly at the sidewalls near the bottom. See FIG. 34. The etch of layer 3410 is selective to layer 120 and, possibly, to silicon 110. In one embodiment, layer 3410 is silicon dioxide, layer 120 is silicon nitride, and the etch of layer 3410 is an HF etch. Other materials and etching techniques can also be used.

Figure 35:
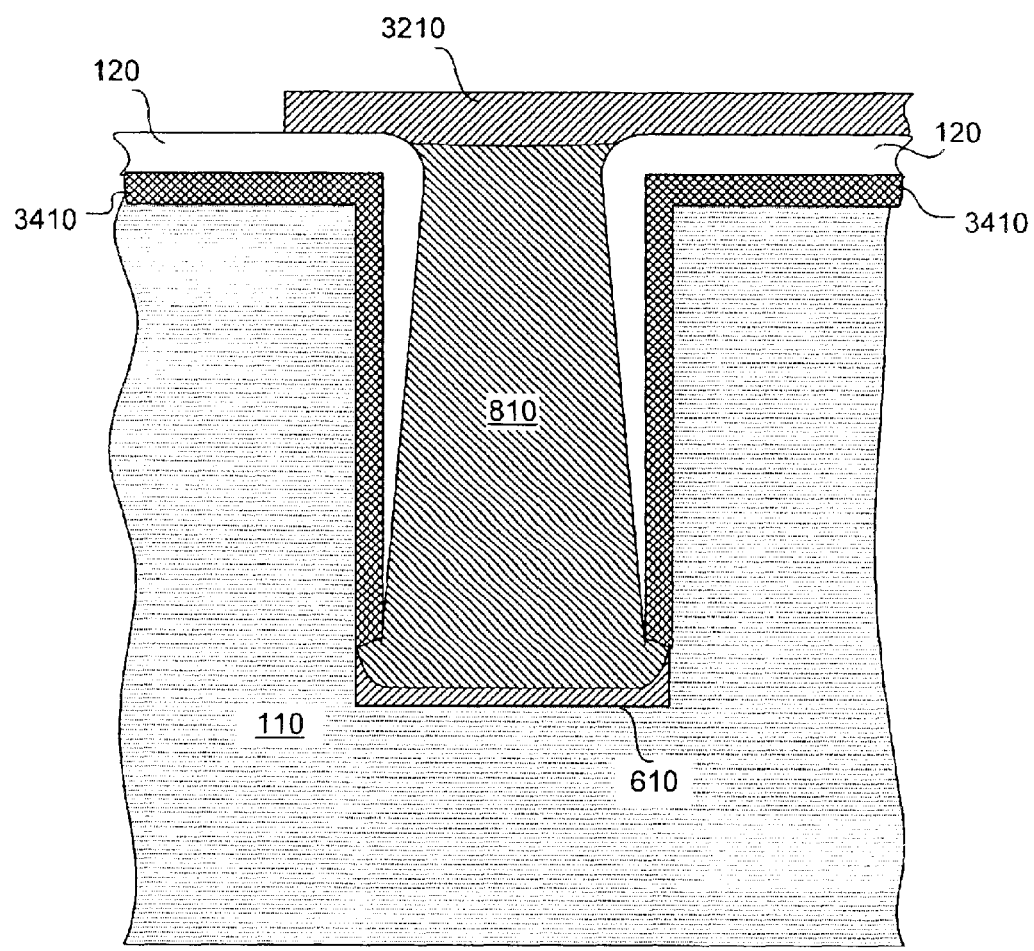

Then the fabrication proceeds as in FIGS. 29–32. Seed layer 610 (FIG. 35) is deposited by electroless plating on the exposed silicon at the bottom of opening 114. Layer 810 is deposited by electroless plating or electroplating in the opening on layer 610. Layer 810 may or may not fill the opening, or may overflow the opening, and may consist of a number of sub-layers as described above in connection with FIG. 32. Layers 610 and 810 be formed as one layer, as described above. Other layers such as layer 3210 can be formed as described above in connection with FIG. 31.

Figure 36:
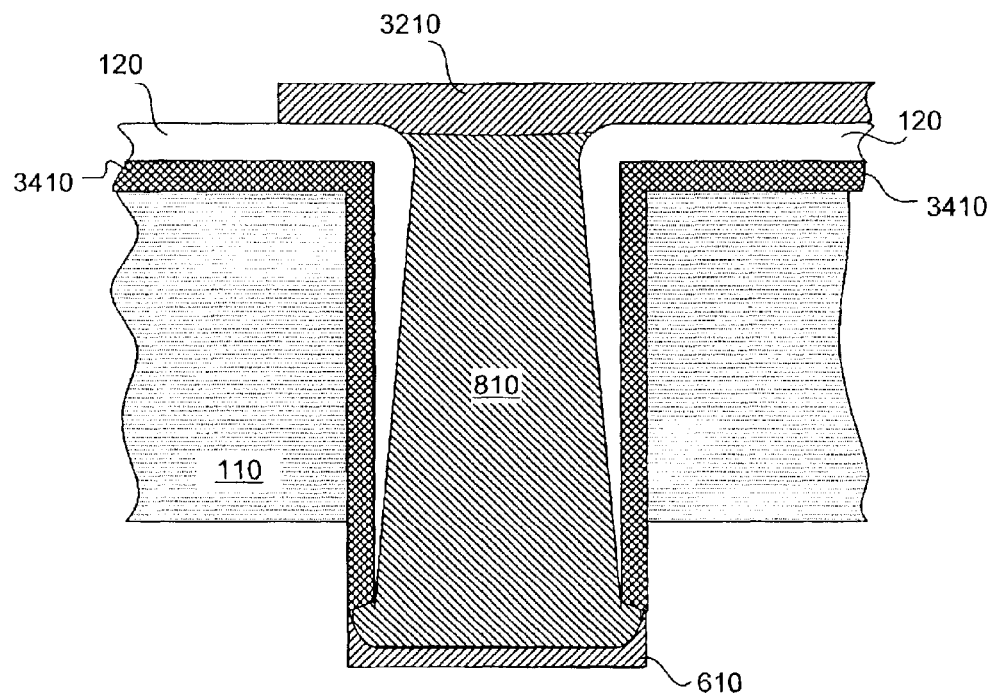

As shown in FIG. 36, the wafer can be thinned from the backside as described above in connection with FIG. 32. In FIG. 36, dielectric layers 3410, 120 protrude down below silicon 110. Layers 610, 810 protrude down farther than the dielectric. Other profiles can also be obtained. Dielectric 3410 may or may not be etched during thinning, and may or may not become gradually thinner when traced down from substrate 110. In some embodiments, dielectric 120 is exposed and attacked in the thinning operation, and layer 810 may become exposed. In FIG. 36, dielectric 3410 is not attacked in the thinning operation, and layer 120 and metal 810 are not exposed.

In some embodiments, layer 120 serves as a barrier to interdiffusion between layer 810 and dielectric 3410. For example, layer 120 can be tantalum oxide ($Ta_2O_5$), and layer 810 can be nickel.

Dielectric 3410 insulates the conductive layers 610, 810 from substrate 110. Therefore, the requirements on the insulating properties of layer 120 can be relaxed. Layer 120 can be a conductive layer, or can be a low quality dielectric. This is advantageous because in some embodiments, the PVD process by which the layer 120 is deposited does not allow as much control over the thickness and quality of the deposited layer as the process that forms the layer 3410.

Figure 37:
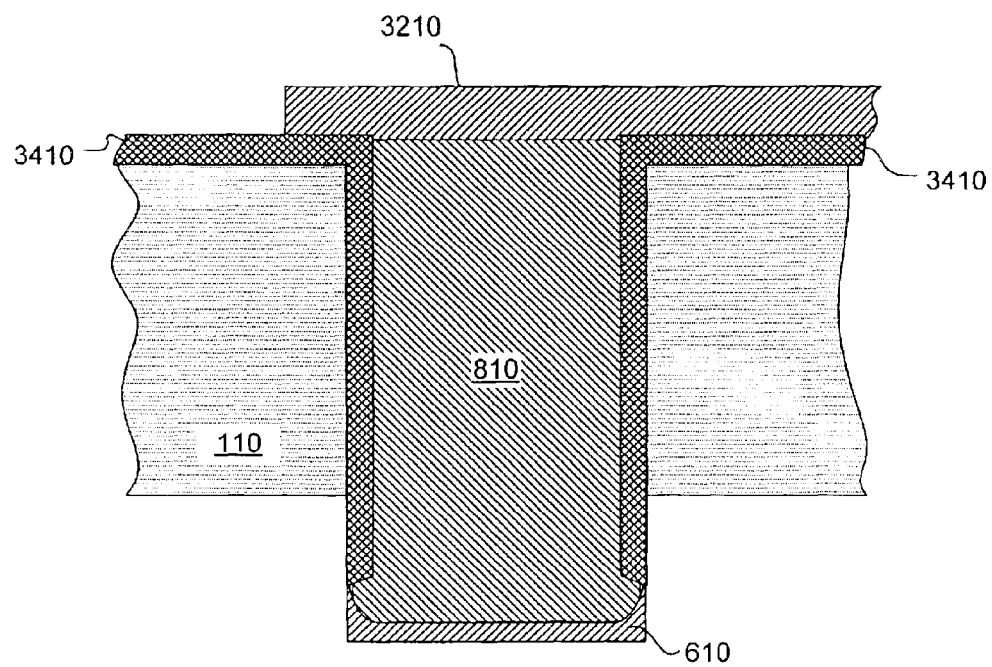

In FIG. 37, layer 120 is removed before the deposition of metal 810. Layer 120 can be removed either before or after the deposition of metal 610. Removal of layer 120 may be desirable if layer 120 may interfere with the deposition of layers 610, 810. One example is when layer 120 could serve as a seed for deposition of layer 610 or 810. Also, if layer 810 is electrodeposited, it may be desirable to remove the layer 120 to reduce the electric current during this deposition.

Figure 38:
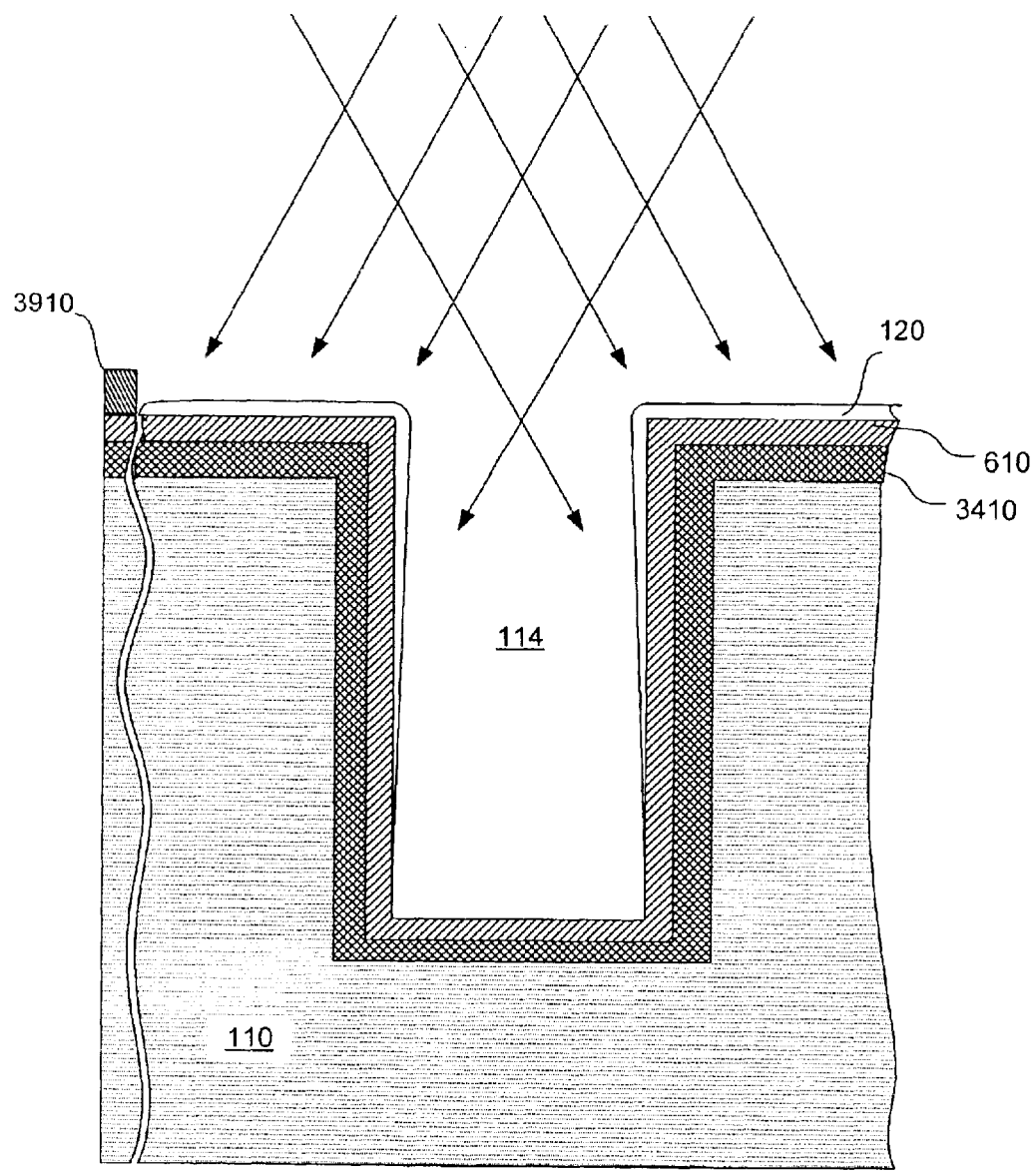

In FIG. 38, opening 114 and dielectric 3410 are formed as in FIG. 33. Then seed layer 610 is deposited over the wafer. We will assume for the sake of illustration that the layer 610 is metal, though this is not necessary. Metal 610 can be formed by PVD, CVD, electroless plating, or other suitable techniques, known or to be invented, and can be a conformal layer. Then dielectric 120 is deposited by PVD as in FIG. 27. Dielectric 120 covers the metal 610 on the sidewalls near the top of the substrate 110 but not on the bottom of opening 114. If dielectric 120 forms on the bottom, it can be cleared by an etch that attacks but does not remove the dielectric 120 on the sidewalls, as described above. Metal 610 can be exposed on the sidewalls near the bottom of the opening.

Figure 39:
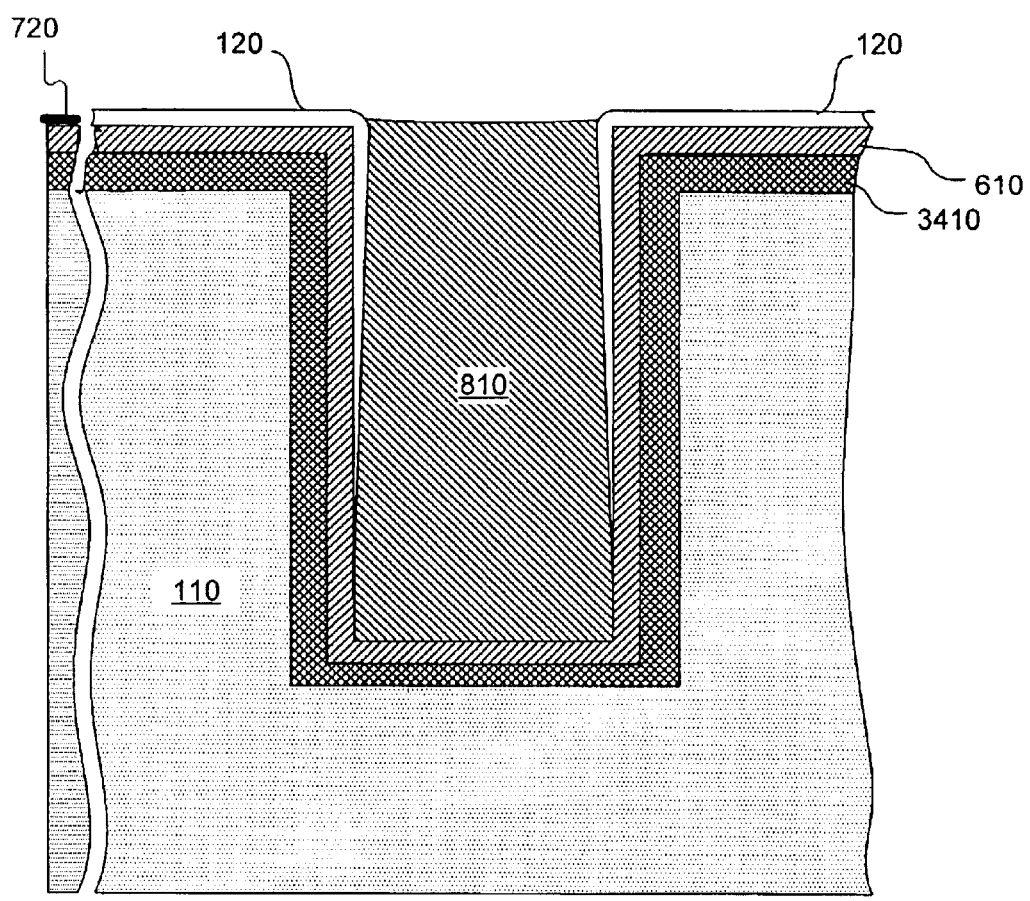

Then layer 810 (FIG. 39) is deposited onto the exposed regions of metal 610 by electroless plating or electrodeposition. We will assume for the sake of illustration that the layer 810 is metal, though this is not necessary. Metal 810 is deposited in opening 114 starting from the bottom of the opening, with metal 610 being a seed, as described above in connection with FIGS. 8–37. In some embodiments, metal 610 is electrically contacted from the top of the wafer for the electrodeposition. In one example, when dielectric 120 is being deposited, metal 610 is masked with a mask 3910 (FIG. 38) in an area which may be a peripheral area of the wafer. After the deposition of dielectric 120, the mask 3910 is removed, and metal 610 becomes exposed. The exposed area of metal 610 can be physically contacted by a cathode terminal 720 (FIG. 39) for the electrodeposition of metal 810.

Figure 40:
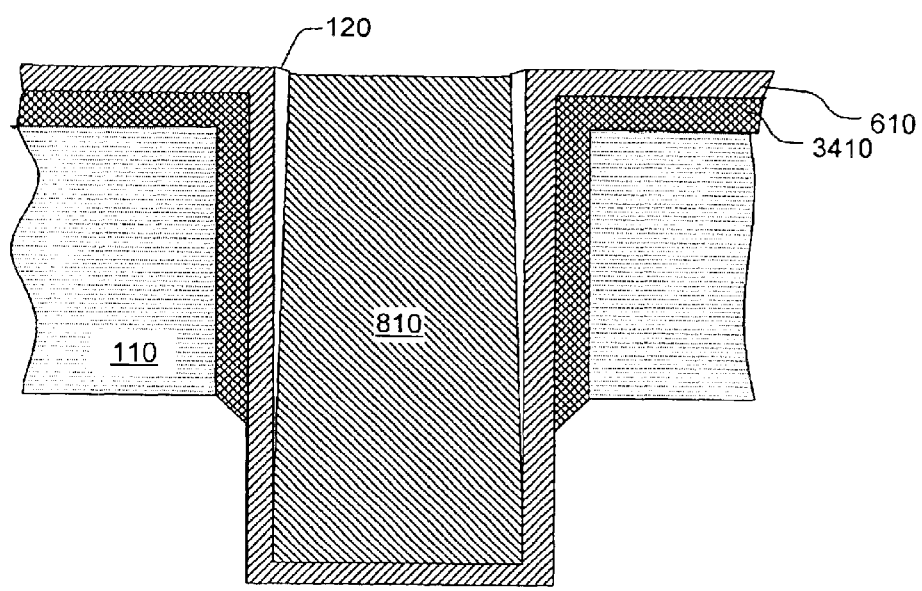

Dielectric 120 can be removed or otherwise patterned at the top of the wafer. See FIG. 40. Other circuit elements can be formed as needed (e.g. to connect the metal 810 to transistor elements 310, 320 or other circuit elements). The wafer can be thinned or otherwise processed on the backside to form contact pads from metal layers 610, 810. The backside processes described above in connection with FIGS. 2, 5, 9–37 can be used, with dielectric 3410 removed on the backside to expose the metal 610 and/or 810.

Figure 41:
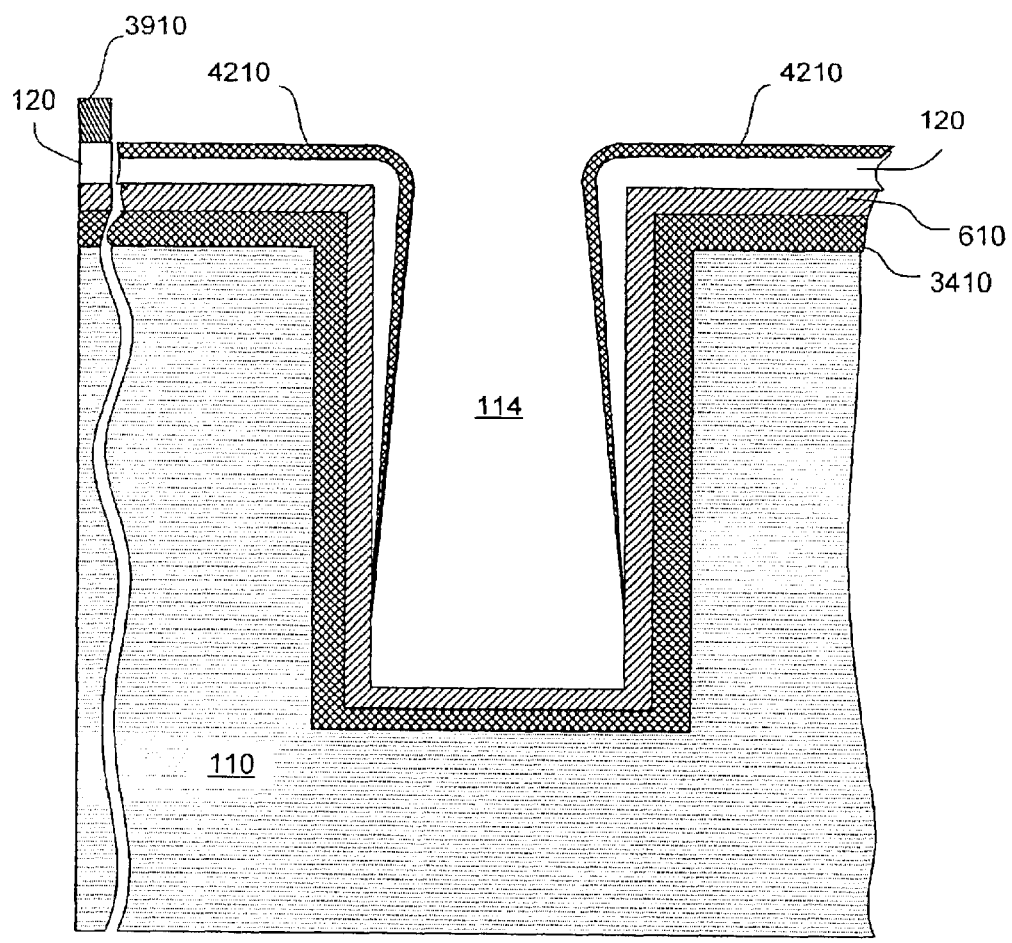

In FIG. 41, the fabrication proceeds as in FIG. 38 through the deposition of layer 610. Then layer 120 is formed so as not to cover the metal 610 at the bottom of opening 114. Layer 120 is metal. Exemplary deposition techniques for layer 120 include PVD and electroplating. In the electroplating embodiments, the metal 120 does not cover the metal 610 at the bottom due to a low current density at the bottom. Suitable materials include a combination of nickel for metal 610 and tantalum for metal 120.

If metal 120 forms on the bottom of opening 114, an etch can be conducted removing the metal 120 from the bottom and attacking, but not completely removing the metal 120 on the sidewalls. No photolithography or other alignment techniques are needed in the opening. The etch does not have to be selective to metal 610 if metal 610 is sufficiently thick.

Metal 120 should have a higher electrochemical potential than the metal 610 for the next step (anodizing).

Metal 120 is anodized in a suitable bath. Oxide 4210 forms on the surface. If metal 120 is tantalum, then layer 4210 is tantalum oxide, primarily $Ta_2O_5$. Exemplary tantalum anodization processes are described in U.S. Pat. No. 5,436,504 issued Jul. 25, 1995, incorporated herein by reference. An exemplary thickness of layer 4210 is 10–100 nm. Due to the higher electrochemical potential of metal 120, the oxide growth does not occur on metal 610. If some oxide grows on metal 610, it can be removed by an etch that does not have to be selective to oxide 4210 due to the greater thickness of oxide 4210.

Figure 42:
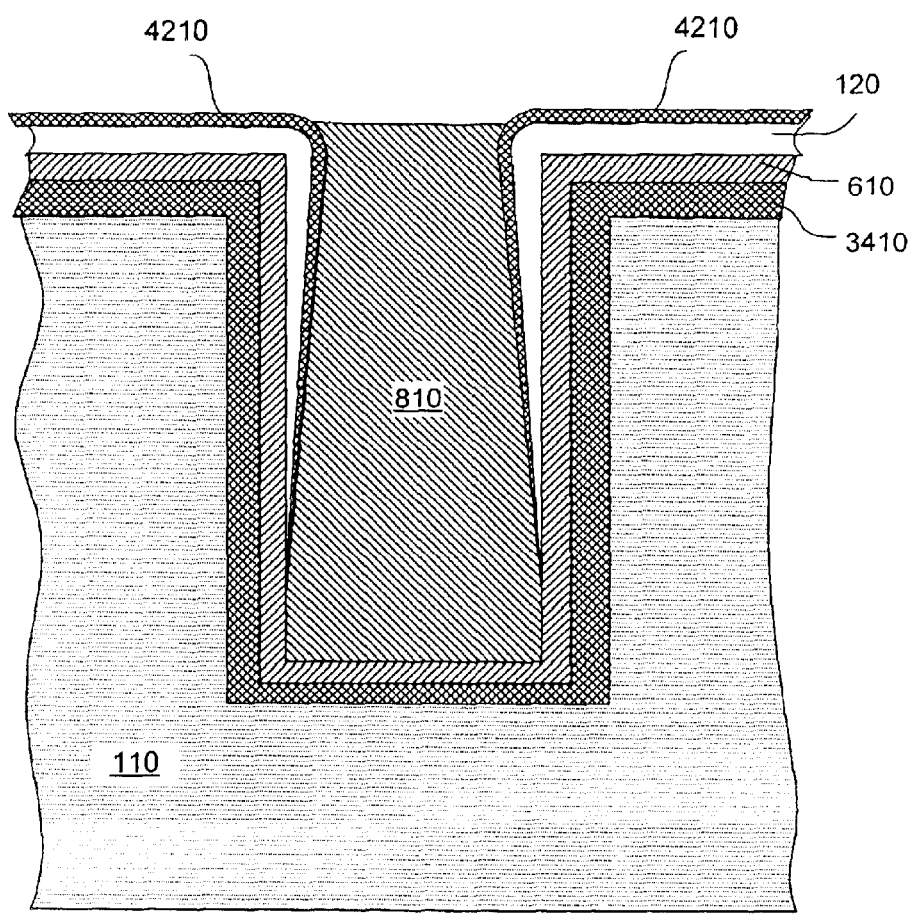

Then metal 810 (FIG. 42) is deposited onto the exposed regions of metal 610 by electroless plating or electrodeposition. Metal 810 is deposited in opening 114 starting from the bottom of the opening, with metal 610 as a seed, as described above in connection with FIGS. 8–39. In some embodiments, metal 610 is electrically contacted from the top of the wafer for the electrodeposition. In one example, when dielectric 120 is being deposited, metal 610 is masked with a mask 3910 (FIG. 41) in an area which may be a peripheral area of the wafer. After the deposition of oxide 4210, the mask 3910 is removed, and metal 610 is exposed. The exposed area of metal 610 can be physically contacted by the cathode for the electrodeposition of metal 810.

Oxide 4210, metal 120 and metal 610 can be removed from the top of the wafer or patterned as desired. Other circuit elements can be formed as needed (e.g. to connect the metal 810 to transistor elements 310, 320 or other devices). In some embodiments, the layers 4210, 120 provide a diffusion barrier for conductive lines formed from metal 610. The diffusion barrier prevents interdiffusion between metal 610 and subsequently deposited layers (which can be polysilicon or silicon dioxide for example). The wafer can be thinned from the backside to form through hole interconnects and backside contact pads as in FIG. 40.

Figure 27:
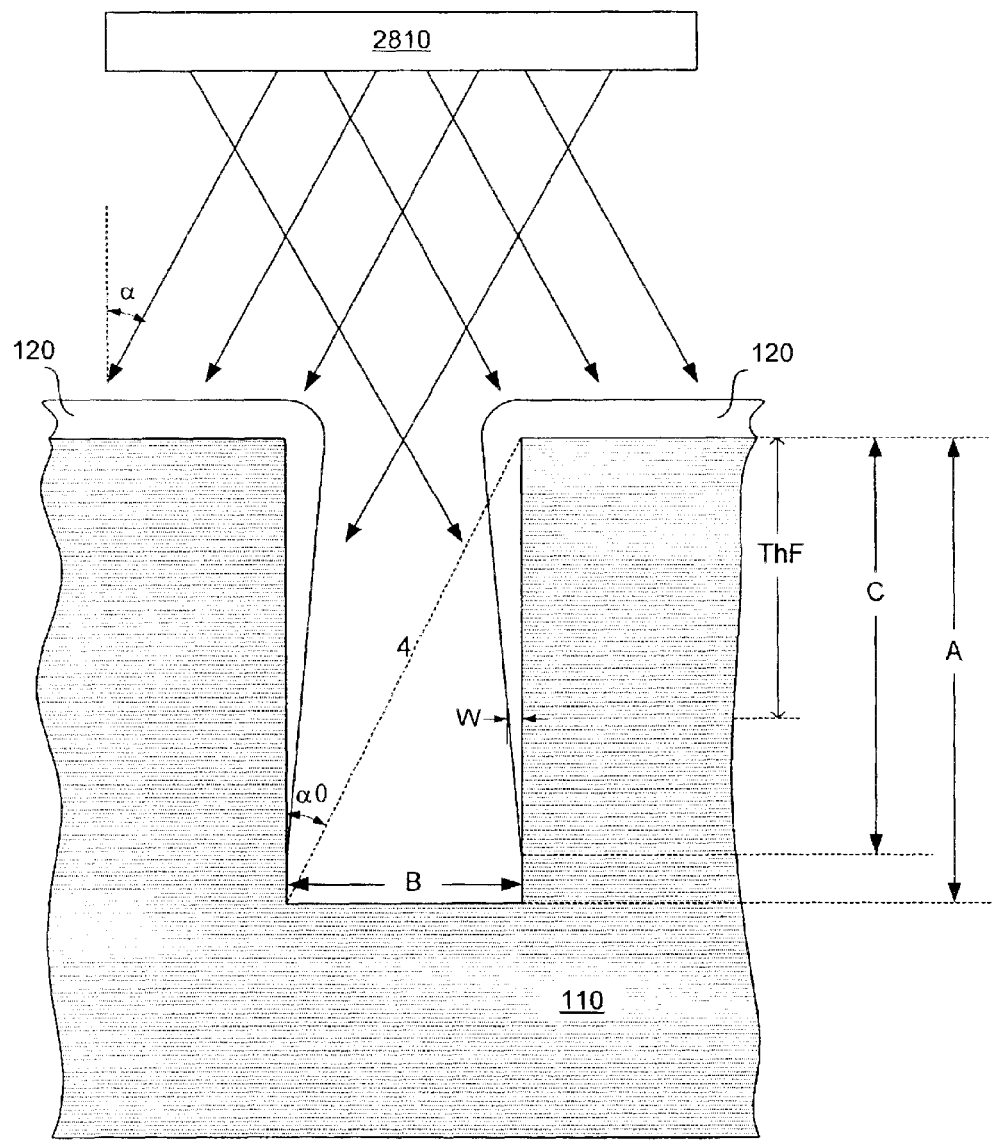

The embodiments described above illustrate but do not limit the invention. For example, layers 610, 810 can be non-metal conductive layers. In FIGS. 27 and 33, dielectric 120 can be formed by a PVD of a non-dielectric material and subsequent conversion of the non-dielectric material to dielectric. For example, tantalum can be deposited by PVD and then anodized to convert the tantalum layer to tantalum oxide. Dielectric 3410 can be formed by depositing a non-dielectric material and then converting it to dielectric. The invention is not limited to particular materials, dimensions, structures, circuits, or fabrication processes, except as defined by the appended claims.

What is claimed is:

1. A manufacturing method comprising:
    forming an opening in a first surface of a body comprising a semiconductor substrate, wherein the opening extends into the semiconductor substrate, and forming a seed for electroplating a conductor into the opening; and
    electroplating the conductor into the opening, wherein the electroplating is initiated on the seed at a distance from the first surface of the body but not over the opening's sidewalls adjacent the first surface of the body;
    wherein either before or after the electroplating operation, a through hole is formed in the semiconductor substrate at the location of the opening;
    wherein the seed is spaced from the first surface of the body; and
    wherein the seed is formed after the through hole.

2. The method of claim 1 wherein forming the opening and the through hole comprises:
    forming the opening in the first surface of the body but not extending the opening through the semiconductor substrate;
    forming a dielectric in the opening over a surface of the opening; and
    removing semiconductor material of the substrate from a second surface of the body to form the through hole.

3. The method of claim 2 further comprising removing the dielectric from the second surface of the body to form a hole in the dielectric at the second surface;
    wherein the seed is deposited over the second surface of the body after forming the hole in the dielectric.

4. The method of claim 3 wherein the seed is formed by sputtering.

5. The method of claim 3 wherein the opening widens as it goes through the semiconductor substrate towards the first surface of the body.

6. The method of claim 3 further comprising, after forming the seed and before the electroplating operation, depositing a masking layer over the seed to impede electroplating onto the second surface.

7. The method of claim 6 further comprising forming an opening in the masking layer;
    wherein the seed is coupled to an electrical potential through the opening in the masking layer during the electroplating operation.

8. The method of claim 3 further comprising, after the electroplating operation, removing at least a portion of the seed from over the second surface, and removing semiconductor material from the second surface to cause the electroplated conductor to protrude out at the second surface.

9. A manufacturing method comprising:
    forming an opening in a first surface of a body comprising a semiconductor substrate, wherein the opening extends into the semiconductor substrate, and forming a seed for electroplating a conductor into the opening; and
    electroplating the conductor into the opening, wherein the electroplating is initiated on the seed at a distance from the first surface of the body but not over the opening's sidewalls adjacent the first surface of the body;
    wherein either before or after the electroplating operation, a through hole is formed in the semiconductor substrate at the location of the opening;
    wherein the method further comprises;
    forming a dry film mask over the first surface of the body;
    forming an opening in the dry film mask over the opening in the body, such that the dry film mask overhangs edges of the opening in the body;
    wherein forming the seed comprises depositing the seed into the opening in the dry film mask.

10. The method of claim 9 further comprising, before forming the dry film mask, forming a conductive layer over the first surface of the body;
    wherein the seed electrically contacts the conductive layer in the opening in the body;
    wherein the method further comprises:
    removing the dry film mask before the electroplating operation to expose the conductive layer over the first surface; and
    coupling the conductive layer to an electrical potential for the electroplating operation, wherein during the electroplating operation the seed is coupled to the electrical potential through the conductive layer.

11. The method of claim 10 wherein the electroplating does not occur on the conductive layer, or the electroplating occurs on the conductive layer slower than on the seed.

12. The method of claim 10 further comprising, before forming the conductive layer, forming a dielectric in the opening in the body over a surface of the opening in the body.

13. The method of claim 9 wherein the through hole in the semiconductor substrate is formed after the electroplating operation by removing semiconductor material from a second surface of the body.

14. The method of claim 13 further comprising:
before forming the conductive layer, forming a dielectric in the opening in the body over a surface of the opening in the body; and
removing the dielectric from the second surface of the body to form a hole in the dielectric at the second surface and expose the conductive layer in the opening.

15. The method of claim 14 wherein the dielectric removal from the second surface of the body continues at least until the conductive layer and/or the electroplated conductor protrude out at the second surface.

16. The method of claim 9 further comprising:
forming a conductive layer over a second surface of the body; and
exposing the conductive layer from the first surface of the body through the opening;
wherein the seed is formed to electrically contact the conductive layer through said through hole, and during the electroplating operation the seed is coupled to an electrical potential through the conductive layer.

17. A manufacturing method comprising:
forming an opening in a first surface of a body comprising a semiconductor substrate, wherein the opening extends into the semiconductor substrate, and forming a seed for electroplating a conductor into the opening; and
electroplating the conductor into the opening, wherein the electroplating is initiated on the seed at a distance from the first surface of the body but not over the opening's sidewalls adjacent the first surface of the body;
wherein either before or after the electroplating operation, a through hole is formed in the semiconductor substrate at the location of the opening;
wherein the method further comprises:
electrodepositing a photoresist layer into the opening in the body over the first surface of the body;
photolithographically forming a hole in the photoresist layer in the opening in the body, wherein the hole does not overlap the opening's sidewalls adjacent the first surface of the body;
wherein forming the seed comprises depositing the seed into the hole in the photoresist layer;
wherein the photoresist layer is removed before the electroplating of the conductor.

18. The method of claim 17 further comprising, before electrodepositing the photoresist layer, forming a conductive layer over the first surface of the body;
wherein the seed electrically contacts the conductive layer in the opening;
wherein the photoresist layer is removed before the electroplating of the conductor to expose the conductive layer over the first surface; and
wherein the method further comprises coupling the conductive layer to an electrical potential for the electroplating of the conductor, wherein during the electroplating of the conductor the seed is coupled to the electrical potential through the conductive layer.

19. The method of claim 18 wherein the electroplating of the conductor does not occur on the conductive layer, or the electroplating of the conductor occurs on the conductive layer slower than on the seed.

20. The method of claim 18 further comprising, before forming the conductive layer, forming a dielectric in the opening in the body over a surface of the opening in the body.

21. The method of claim 17 wherein the through hole in the semiconductor substrate is formed after the electroplating of the conductor by removing semiconductor material from a second surface of the body.

22. The method of claim 21 further comprising, before electrodepositing the photoresist layer;
forming a dielectric in the opening in the body; and
before forming a conductive layer over the dielectric;
wherein the method further comprises removing the dielectric from the second surface of the body to form a hole in the dielectric at the second surface and expose the conductive layer in the opening.

23. The method of claim 22 wherein the dielectric removal from the second surface of the body continues at least until the conductive layer and/or the electroplated conductor protrude out at the second surface.

24. The method of claim 17 further comprising forming a conductive layer over a second surface of the body;
wherein the opening made in the first surface of the body reaches the conductive layer; and
wherein the seed electrically contacts the conductive layer through the opening, and during the electroplating operation the seed is coupled to an electrical potential through the conductive layer.

25. The method of claim 17 further comprising, before electrodepositing the photoresist layer, forming a conductive layer in the opening, wherein the photoresist layer is deposited on the conductive layer.

26. The method of claim 25 further comprising, after forming the hole in the photoresist layer, removing at least the conductive layer through the hole in the photoresist layer to expose the semiconductor substrate;
wherein the seed is formed by electroless plating on the exposed semiconductor substrate.

27. The method of claim 25 wherein the seed forms at least part of the conductive layer, and during the electroplating of the conductor the photoresist covers the opening's sidewalls adjacent the first surface of the body.

28. A manufacturing method comprising:
forming an opening in a first surface of a body comprising a semiconductor substrate, wherein the opening extends into the semiconductor substrate, and forming a seed for electroplating a conductor into the opening; and
electroplating the conductor into the opening, wherein the electroplating is initiated on the seed at a distance from the first surface of the body but not over the opening's sidewalls adjacent the first surface of the body;
wherein either before or after the electroplating operation, a through hole is formed in the semiconductor substrate at the location of the opening;
wherein the seed is formed to extend to the first surface of the body, but before the electroplating operation a first layer is formed to cover the seed over the opening's sidewalls adjacent the first surface of the body but not at a distance from the first surface of the body, to prevent the electroplating from being initiated over the opening's sidewalls adjacent the first surface of the body.

29. A manufacturing method comprising:
forming an opening in a first surface of a body comprising a semiconductor substrate, wherein the opening extends into the semiconductor substrate, and forming a seed for electroplating a conductor into the opening; and electroplating the conductor into the opening, wherein the electroplating is initiated on the seed at a distance from the first surface of the body but not over the opening's sidewalls adjacent the first surface of the body;

wherein either before or after the electroplating operation, a through hole is formed in the semiconductor substrate at the location of the opening;

wherein the method further comprises forming an integrated circuit having one or more circuit elements connected to the conductor by one or more interconnects.

30. A manufacturing method comprising:

forming an opening in a first surface of a body comprising a semiconductor substrate, wherein the opening extends into the semiconductor substrate;

electrodepositing a photoresist layer into the opening in the body over the first surface of the body;

photolithographically forming a hole in the photoresist layer in the opening in the body, wherein the hole is spaced from the opening's edges at the first surface of the body, and exposing the semiconductor substrate through the hole in the photoresist layer;

forming a conductor in the opening, wherein at least a portion of the conductor is formed by electroless plating on the semiconductor substrate exposed through the hole in the photoresist layer while the opening's sidewalls adjacent the first surface of the body are covered by the photoresist layer.

31. A manufacturing method comprising:

forming a through hole passing between a first surface and a second surface of a body;

after forming the through hole, depositing a seed on the second surface of the body, wherein the through hole is open at the second surface but the seed does not extend to the first surface of the body; and electroplating a conductor into the through hole, wherein the electroplating is initiated on the seed at a distance from the first surface of the body but not over the through hole's sidewalls adjacent the first surface of the body.

32. The method of claim 31 wherein the through hole is wider at the first surface than at the second surface, and the seed is deposited by physical vapor deposition (PVD).

33. A manufacturing method comprising:

forming an opening in a first surface of a body;

forming a dry film mask over the first surface of the body;

forming an opening in the dry film mask over the opening in the body, such that the dry film mask overhangs edges of the opening in the body;

depositing a seed over the first surface of the body, the seed entering into the opening in the dry film mask and being deposited in the opening on the body, wherein the overhanging edges of the dry film mask prevent the seed from being deposited on a sidewalls of the opening adjacent the first surface of the body; and electroplating a conductor onto the seed into the opening.

34. The method of claim 33 wherein the body comprises a semiconductor substrate, and the opening extends into the semiconductor substrate.

35. The method of claim 34 wherein the conductor is a circuit element of an integrated circuit.

36. The method of claim 33 wherein the body comprises a semiconductor substrate and a dielectric layer formed over the semiconductor substrate, and the opening extends into the dielectric layer but does not extend into the semiconductor substrate.

37. A manufacturing method comprising:

forming an opening in a first surface of a body which comprises semiconductor material;

forming a first dielectric layer over the body by a process that includes a non-conformal physical vapor deposition (PVD) and/or electroplating, wherein said non-conformal PVD and/or electroplating operation causes the first dielectric layer to form over at least a portion of the opening's sidewalls adjacent the first surface of the body but not over at least a portion of the opening's bottom surface;

after forming the first dielectric layer, depositing a first conductive layer by a process that includes electroless plating and/or electroplating of the first conductive layer onto the semiconductor material at the bottom of the opening.

38. The method of claim 37 wherein the first dielectric layer is formed by PVD.

39. The method of claim 37 further comprising removing material from a second surface of the body opposite to the first surface to expose the first conductive layer.

40. The method of claim 37 wherein the first conductive layer comprises:

a first metal sub-layer deposited by electroless plating onto the semiconductor material at the bottom of the opening; and a second metal sub-layer deposited by electroplating onto the first sub-layer.

41. The method of claim 37 wherein the first conductive layer comprises:

a first sub-layer deposited by electroless plating and/or electroplating onto the semiconductor material at the bottom of the opening; and a second sub-layer deposited by electroless plating and/or electroplating onto the first sub-layer;

wherein the first sub-layer is not solderable, and the second sub-layer is solderable; and the method further comprises removing material from a second surface of the body opposite to the first surface to expose the second sub-layer.

42. The method of claim 41 further comprising soldering the exposed second sub-layer to a contact of an integrated circuit or a contact on a wiring substrate.

43. The method of claim 37 wherein the first conductive layer is deposited to at least the first surface of the body to fill the opening.

44. A manufacturing method comprising:

forming an opening in a first surface of a body which comprises semiconductor material;

forming a first dielectric layer over the body by a process that includes a non-conformal physical vapor deposition (PVD) and/or electroplating, wherein said non-conformal PVD and/or electroplating operation causes the first dielectric layer to form over at least a portion of the opening's sidewalls adjacent the first surface of the body;

after forming the first dielectric layer, depositing a first conductive layer by a process that includes electroless plating and/or electroplating of the first conductive layer on the semiconductor material at the bottom of the opening;

wherein in said process that forms the first dielectric layer;
(i) the PVD and/or electroplating operation is non-conformal to cause the semiconductor material at the bottom of the opening to be accessible for said electroless plating and/or electroplating of the first conductive layer thereon; and/or
(ii) the first dielectric layer at the bottom of the opening is etched to make the semiconductor material at the bottom of the opening accessible for said electroless plating and/or electroplating of the conductive layer thereon, wherein the etch etches the entire surface of the first dielectric layer on the sidewalls of the opening but does not remove all of the first dielectric layer on the sidewalls of the opening.

45. The method of claim 44 wherein the first dielectric layer is formed by PVD.

46. The method of claim 44 further comprising removing material from a second surface of the body opposite to the first surface to expose the first conductive layer.

47. The method of claim 44 wherein the first conductive layer comprises:
a first sub-layer deposited by electroless plating onto the semiconductor material at the bottom of the opening; and
a second sub-layer deposited by electroplating onto the first sub-layer.

48. The method of claim 44 wherein the first conductive layer comprises:
a first sub-layer deposited by electroless plating and/or electroplating onto the bottom of the opening; and
a second sub-layer deposited by electroless plating and/or electroplating onto the first sub-layer;
wherein the first sub-layer is not solderable, and the second sub-layer is solderable; and
the method further comprises removing material from a second surface of the body opposite to the first surface to expose the second sub-layer.

49. The method of claim 48 further comprising soldering the exposed second sub-layer to a contact of an integrated circuit or a contact on a wiring substrate.

50. The method of claim 44 wherein the first conductive layer is deposited to at least a level of the first surface of the body so that the opening is filled when the first conductive layer has been deposited.

51. A manufacturing method comprising:
forming an opening in a first surface of a body which comprises semiconductor material;
forming a first dielectric layer in the opening;
forming a first layer over the first dielectric layer by a process that includes a non-conformal physical vapor deposition (PVD) and/or electroplating, wherein said non-conformal PVD and/or electroplating operation causes the first layer to form over at least a portion of the opening's sidewalls adjacent the first surface of the body but not over at least a portion of the opening's bottom surface;
etching the first dielectric layer by an etch selective to the first layer, to remove the first dielectric layer from at least said portion of the opening's bottom surface;
after etching the first dielectric layer, depositing a first conductive layer by a process that includes electroless plating and/or electroplating of the first conductive layer onto the semiconductor material at the bottom of the opening.

52. The method of claim 51 wherein the first layer is formed by PVD.

53. The method of claim 51 further comprising removing material from a second surface of the body opposite to the first surface to expose the first conductive layer.

54. The method of claim 51 wherein the first conductive layer comprises:
a first metal sub-layer deposited by electroless plating onto the semiconductor material at the bottom of the opening; and
a second metal sub-layer deposited by electroplating onto the first sub-layer.

55. The method of claim 51 wherein the first conductive layer comprises:
a first sub-layer deposited by electroless plating and/or electroplating onto the semiconductor material at the bottom of the opening; and
a second sub-layer deposited by electroless plating and/or electroplating onto the first sub-layer;
wherein the first sub-layer is not solderable, and the second sub-layer is solderable; and
the method further comprises removing material from a second surface of the body opposite to the first surface to expose the second sub-layer.

56. The method of claim 55 further comprising soldering the exposed second sub-layer to a contact of an integrated circuit or a contact on a wiring substrate.

57. The method of claim 51 wherein the first conductive layer is deposited to at least the first surface of the body to fill the opening.

58. The method of claim 51 further comprising removing the first layer after etching of the first dielectric layer.

59. A manufacturing method comprising:
forming an opening in a first surface of a body which comprises semiconductor material;
forming a first dielectric layer in the opening;
forming a first layer over the first dielectric layer by a process that includes a non-conformal physical vapor deposition (PVD) and/or electroplating, wherein said non-conformal PVD and/or electroplating operation causes the first layer to form over at least a portion of the opening's sidewalls adjacent the first surface of the body;
etching the first dielectric layer by an etch selective to the first layer, to remove the first dielectric layer from at least a portion of the opening's bottom surface;
after etching the first dielectric layer, depositing a first conductive layer by a process that includes electroless plating and/or electroplating of the first conductive layer onto the semiconductor material at the bottom of the opening;
wherein in said process that forms the first layer;
(i) the PVD and/or electroplating operation is non-conformal to cause the first dielectric layer at the bottom of the opening to be accessible for being etched selectively to the first layer; and/or
(ii) the first layer is etched at the bottom of the opening to make the first dielectric layer at the bottom of the opening accessible for being etched, wherein the etch of the first layer etches the entire surface of the first layer in the opening but does not remove all of the first layer on the sidewalls of the opening.

60. The method of claim 59 wherein the first layer is formed by PVD.

61. The method of claim 59 further comprising removing material from a second surface of the body opposite to the first surface to expose the first conductive layer.

62. The method of claim 59 wherein the first conductive layer comprises:
  first metal sub-layer deposited by electroless plating onto the semiconductor material at the bottom of the opening; and
  a second metal sub-layer deposited by electroplating onto the first sub-layer.

63. The method of claim 59 wherein the first conductive layer comprises:
  a first sub-layer deposited by electroless plating and/or electroplating onto the semiconductor material at the bottom of the opening; and
  a second sub-layer deposited by electroless plating and/or electroplating onto the first sub-layer;
  wherein the first sub-layer is not solderable, and the second sub-layer is solderable; and
  the method further comprises removing material from a second surface of the body opposite to the first surface to expose the second sub-layer.

64. The method of claim 63 further comprising soldering the exposed second sub-layer to a contact of an integrated circuit or a contact on a wiring substrate.

65. The method of claim 59 wherein the first conductive layer is deposited to at least the first surface of the body to fill the opening.

66. The method of claim 59 further comprising removing the first layer after etching of the first dielectric layer.

67. A manufacturing method comprising:
  forming an opening in a first surface of a body which comprises semiconductor material;
  forming a first dielectric layer in the opening;
  forming a first conductive layer in the opening over the first dielectric layer;
  forming a first layer over the first conductive layer by a process that includes a non-conformal physical vapor deposition (PVD) and/or electroplating, wherein said non-conformal PVD and/or electroplating operation causes the first layer to form over at least a portion of the opening's sidewalls adjacent the first surface of the body but not over at least a portion of the opening's bottom surface;
  after forming the first layer, depositing a second conductive layer by a process that includes electroless plating or electroplating process of the second conductive layer onto the first conductive layer at the bottom of the opening.

68. The method of claim 67 wherein the first layer comprises metal deposited by PVD and/or electroplating, and the process that forms the first layer comprises anodizing the metal to form a non-conductive oxide.

69. The method of claim 68 wherein the metal has a higher electrochemical potential than a top surface of the first conductive layer.

70. The method of claim 68 wherein forming the second conductive layer comprises electroplating.

71. The method of claim 67 further comprising removing material from a second surface of the body opposite to the first surface to expose the first conductive layer.

72. The method of claim 67 wherein at least a bottom portion of the first conductive layer is not solderable, but at least one of the first and second conductive layers comprises a solderable layer; and
  the method further comprises removing material from a second surface of the body opposite to the first surface to expose the solderable layer.

73. The method of claim 67 wherein the second conductive layer is deposited to at least the first surface of the body to fill the opening.

74. A manufacturing method comprising:
  forming an opening in a first surface of a body which comprises semiconductor material;
  forming a first dielectric layer in the opening;
  forming a first conductive layer in the opening over the first dielectric layer;
  forming a first layer over the first conductive layer by a process that includes a non-conformal physical vapor deposition (PVD) and/or electroplating, wherein said non-conformal PVD and/or electroplating operation causes the first layer to form over at least a portion of the opening's sidewalls adjacent the first surface of the body;
  after forming the first layer, depositing a second conductive layer by a process that includes electroless plating and/or electroplating of the second conductive layer onto the first conductive layer at the bottom of the opening;
  wherein in the process that forms the first layer;
    (i) the PVD and/or electroplating operation is non-conformal to cause the first conductive layer at the bottom of the opening to be accessible for plating the second conductive layer thereon; and/or
    (ii) the first layer is etched at the bottom of the opening to make the first conductive layer at the bottom of the opening accessible for the plating of the second conductive layer thereon, wherein the etch of the first layer etches the entire first layer exposed in the opening but does not remove all of the first layer on the sidewalls of the opening.

75. The method of claim 74 wherein the first layer comprises metal deposited by PVD and/or electroplating, and the process that forms the first layer comprises anodizing the metal to form a non-conductive oxide.

76. The method of claim 75 wherein the metal has a higher electrochemical potential than a top surface of the first conductive layer.

77. The method of claim 74 wherein forming the second conductive layer comprises electroplating.

78. The method of claim 74 further comprising removing material from a second surface of the body opposite to the first surface to expose the first conductive layer.

79. The method of claim 74 wherein at least a bottom portion of the first conductive layer is not solderable, but at least one of the first and second conductive layers comprises a solderable layer; and
  the method further comprises removing material from a second surface of the body opposite to the first surface to expose the solderable layer.

80. The method of claim 74 wherein the second conductive layer is deposited to at least the first surface of the body to fill the opening.

* * * * *